United States Patent
Yamazaki et al.

(10) Patent No.: US 9,324,971 B2
(45) Date of Patent: Apr. 26, 2016

(54) LIGHT-EMITTING MODULE AND LIGHT-EMITTING DEVICE

(71) Applicant: Semiconductor Energy Laboratory Co., Ltd., Kanagawa-ken (JP)

(72) Inventors: Shunpei Yamazaki, Tokyo (JP); Yoshiharu Hirakata, Kanagawa (JP); Nozomu Sugisawa, Kanagawa (JP); Hisao Ikeda, Kanagawa (JP); Noriko Miyairi, Kanagawa (JP); Naoyuki Senda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/218,225

(22) Filed: Mar. 18, 2014

(65) Prior Publication Data
US 2014/0284642 A1 Sep. 25, 2014

(30) Foreign Application Priority Data
Mar. 20, 2013 (JP) .................................. 2013-057440

(51) Int. Cl.
| H01L 33/20 | (2010.01) |
| H01L 33/60 | (2010.01) |
| H01L 51/52 | (2006.01) |

(52) U.S. Cl.
CPC ............ *H01L 51/5275* (2013.01); *H01L 33/20* (2013.01); *H01L 33/60* (2013.01); *H01L 2251/558* (2013.01)

(58) Field of Classification Search
USPC .................. 257/98, 40, 79–83, 290, E51.022, 257/E31.105
See application file for complete search history.

(56) References Cited

U.S. PATENT DOCUMENTS

| 4,774,435 | A | 9/1988 | Levinson |
| 6,340,824 | B1* | 1/2002 | Komoto et al. ................. 257/99 |
| 6,714,268 | B2 | 3/2004 | Wang et al. |
| 6,762,553 | B1 | 7/2004 | Yokogawa et al. |
| 7,202,504 | B2 | 4/2007 | Ikeda et al. |
| 7,229,900 | B2 | 6/2007 | Takayama et al. |
| 7,554,263 | B2 | 6/2009 | Takahashi |
| 8,159,449 | B2 | 4/2012 | Kimura et al. |
| 2009/0045422 | A1* | 2/2009 | Kato et al. ....................... 257/98 |
| 2011/0057178 | A1* | 3/2011 | Shitagaki et al. ............... 257/40 |
| 2011/0234088 | A1* | 9/2011 | Abe ............................... 313/504 |

(Continued)

FOREIGN PATENT DOCUMENTS

| JP | 2004-055404 A | 2/2004 |
| JP | 2005197317 A * | 7/2005 |
| JP | 2013-038069 A | 2/2013 |

*Primary Examiner* — Michelle Mandala
*Assistant Examiner* — Tyler Drye
(74) *Attorney, Agent, or Firm* — Husch Blackwell LLP

(57) ABSTRACT

A light-emitting module which efficiently extracts light emitted from a light-emitting element is provided. Alternatively, a light-emitting module having lower power consumption or improved reliability is provided. A light-emitting module includes a window material having a light-transmitting property, a light-emitting element that emits light transmitted from a light-transmitting layer to the window material, and an optical bonding layer between the window material and the light-transmitting layer. The optical bonding layer includes a thick part overlapping the light-emitting element and a thin part surrounding the thick part. The light-transmitting layer, the optical bonding layer, and the window material are provided in decreasing order of refractive index.

20 Claims, 12 Drawing Sheets

(56) References Cited

U.S. PATENT DOCUMENTS

| | | | |
|---|---|---|---|
| 2012/0126273 A1* | 5/2012 | Korotkov et al. | 257/98 |
| 2012/0161166 A1* | 6/2012 | Yamazaki | 257/88 |
| 2013/0009194 A1 | 1/2013 | Yamazaki et al. | |
| 2013/0015486 A1* | 1/2013 | Sekine et al. | 257/98 |
| 2013/0037843 A1* | 2/2013 | Yamao et al. | 257/98 |
| 2013/0056781 A1* | 3/2013 | Suenaga | 257/98 |
| 2013/0063684 A1* | 3/2013 | Chen et al. | 349/96 |
| 2014/0054572 A1* | 2/2014 | Li et al. | 257/40 |

* cited by examiner

LIGHT-EMITTING MODULE AND LIGHT-EMITTING DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. In particular, the present invention relates to a light-emitting module including a light-emitting element and a functional layer, and a light-emitting device including the light-emitting module.

2. Description of the Related Art

The light-emitting module including, between a first substrate and a second substrate, a first electrode provided over the first substrate, a second electrode provided over the first electrode with a layer containing a light-emitting organic compound provided therebetween, and a sacrifice layer formed using a liquid material provided over the second electrode is known (Patent Document 1).

PATENT DOCUMENT

[Patent Document] Japanese Published Patent Application No. 2013-38069

SUMMARY OF THE INVENTION

A light-emitting module with favorable energy efficiency is demanded. A light-emitting module with high reliability is demanded.

One embodiment of the present invention is made in view of the foregoing technical background. Thus, an object is to provide a novel light-emitting module. Another object is to provide a novel light-emitting device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a light-emitting module including a window material having a light-transmitting property, a light-emitting element that emits light transmitted from a light-transmitting layer to the window material, and an optical bonding layer between the window material and the light-transmitting layer. The optical bonding layer includes a thick part and a thin part. The thick part overlaps the light-emitting element. The thin part is thinner than the thick part and provided around the thick part. The light-emitting element includes an upper electrode, a lower electrode overlapping with the upper electrode, and a layer containing a light-emitting organic compound between the upper electrode and the lower electrode. The refractive index of the optical bonding layer is higher than or equal to that of the layer containing a light-emitting organic compound and higher than that of the window material.

The light-emitting module of one embodiment of the present invention has a lens-like curved surface (a curved surface whose surface is continuous and smooth) at the boundary between the thick part and the thin part of the optical bonding layer. Thus, the optical bonding layer is formed to have a lens shape, which is provided along an end portion of a light-emitting region to direct light emitted from the end portion of the light-emitting region toward the window material. As a result, a light-emitting module that can efficiently extract light emitted from a light-emitting element can be provided. Further, because the same amount of light can be extracted with smaller amount of power, a light-emitting module with reduced power consumption can be provided. Further, because unnecessary heat generation caused by power is suppressed, a light-emitting module with improved reliability can be provided.

In addition, one embodiment of the present invention is a light-emitting module including a window material having a light-transmitting property, a light-emitting element that emits light transmitted from a light-transmitting layer to the window material, an optical bonding layer between the window material and the light-transmitting layer, and a partition wall surrounding the light-emitting element. The optical bonding layer includes a thick part and a thin part. The thick part overlaps the light-emitting element. The thin part is thinner than the thick part and provided around the thick part. The light-emitting element includes an upper electrode, a lower electrode overlapping with the upper electrode, and a layer containing a light-emitting organic compound between the upper electrode and the lower electrode. The partition wall has an opening which is widened in a direction in which the light-emitting element emits light. A bottom surface of the opening is in contact with the lower electrode and a side surface of the opening is in contact with the layer containing a light-emitting organic compound. The refractive index of the partition wall is lower than that of the layer containing a light-emitting organic compound.

The light-emitting module of one embodiment of the present invention includes the partition wall having the opening which is widened in a direction in which the light-emitting element emits light. Thus, light emitted from the layer containing a light-emitting organic compound is difficult to enter the inside of the partition wall and is directed to the window material. Accordingly, a light-emitting module that can efficiently extract light emitted from a light-emitting element can be provided. Further, because the same amount of light can be extracted with smaller amount of power, a light-emitting module with reduced power consumption can be provided. Further, because unnecessary heat generation caused by power is suppressed, a light-emitting module with improved reliability can be provided.

Further, one embodiment of the present invention is a light-emitting module including a window material having a light-transmitting property, a light-emitting element that emits light transmitted from a light-transmitting layer to the window material, and an optical bonding layer between the window material and the light-transmitting layer. The optical bonding layer includes a thick part and a thin part. The thick part overlaps the light-emitting element. The thin part is thinner than the thick part and provided around the thick part. The light-emitting element includes an upper electrode, a lower electrode overlapping with the upper electrode, and a layer containing a light-emitting organic compound between the upper electrode and the lower electrode. A bottom surface of the opening is in contact with the lower electrode and a side surface of the opening is in contact with the layer containing a light-emitting organic compound. The optical bonding layer has a refractive index lower than that of the window material and larger than that of the window material and contains a birefringence material whose refractive index is reduced toward the window material side.

Thus, the optical bonding layer is foil red to have a lens shape, which is provided along an end portion of a light-emitting region to direct light emitted from the end portion of the light-emitting region toward the window material. Accordingly, a difference in refractive index between the light-transmitting layer and the optical bonding layer and a difference in refractive index between the optical bonding layer and the window material can be reduced. As a result, light emitted from the light-emitting element easily enters the optical bonding layer and the window material.

Accordingly, a light-emitting module that can efficiently extract light emitted from a light-emitting element can be provided. Further, because the same amount of light can be extracted with smaller amount of power, a light-emitting module with reduced power consumption can be provided. Further, because unnecessary heat generation caused by power is suppressed, a light-emitting module with improved reliability can be provided.

The light-emitting element of one embodiment of the present invention includes a light-emitting region of larger than or equal to 400 $\mu m^2$ and smaller than 3500 $\mu m^2$, preferably larger than or equal to 800 $\mu m^2$ and smaller than 1500 $\mu m^2$. In addition, the above-described light-emitting module includes the thin part which is provided along the end portion of the light-emitting region.

There is light emitted from the end portion of a light-emitting region and lost without going toward the window material. The proportion of lost light that is emitted from the end portion of the light-emitting region to total light that is emitted from the light-emitting element is higher as the area of the light-emitting region is small. The optical bonding layer can be formed in a lens-like shape along the end portion of the light-emitting region. The lens-like optical bonding layer can direct light, which is emitted from the end portion of the light-emitting region and might be lost, toward the window material. Consequently, the effect of increasing efficiency of extracting light from the window material becomes prominent as the area of the light-emitting region is small.

Accordingly, a light-emitting module that can efficiently extract light emitted from a light-emitting element can be provided. Further, because the same amount of light can be extracted with smaller amount of power, a light-emitting module with reduced power consumption can be provided. Further, because unnecessary heat generation caused by power is suppressed, a light-emitting module with improved reliability can be provided.

Furthermore, one embodiment of the present invention is a light-emitting module including a window material having a light-transmitting property, a light-emitting element that emits light transmitted from a light-transmitting layer to the window material, and an optical bonding layer between the window material and the light-transmitting layer. The optical bonding layer includes a thick part and a thin part. The thick part overlaps the light-emitting element. The thin part is thinner than the thick part and provided around the thick part. Further, the light-emitting element includes an upper electrode, a lower electrode overlapping with the upper electrode, and a layer containing a light-emitting organic compound between the upper electrode and the lower electrode. The window material has a refractive index of higher than or equal to 1.5 and lower than or equal to 1.65. The light-transmitting layer also serves as the upper electrode of the light-emitting element and has a refractive index of higher than or equal to 1.7 and lower than or equal to 2.1. The optical bonding layer has a refractive index of higher than 1.5 and lower than or equal to 3.0.

As a result, light emitted from the light-emitting element easily enters the optical bonding layer and the window material. Accordingly, a light-emitting module that can efficiently extract light emitted from a light-emitting element can be provided. Further, because the same amount of light can be extracted with smaller amount of power, a light-emitting module with reduced power consumption can be provided. Further, because unnecessary heat generation caused by power is suppressed, a light-emitting module with improved reliability can be provided.

In addition, one embodiment of the present invention is the above-described light-emitting module in which the optical bonding layer contains a liquid crystal having a refractive index with respect to one of an ordinary ray and an extraordinary ray of 1.65 or lower and a refractive index to the other of 1.75 or higher.

Accordingly, a difference in refractive index between the light-transmitting layer and the optical bonding layer and a difference in refractive index between the optical bonding layer and the window material can be reduced. The refractive index of a region of the optical bonding layer being in contact with the window material can differ from the refractive index of a region of the optical bonding layer being in contact with the light-transmitting layer. Accordingly, a light-emitting module that can efficiently extract light emitted from a light-emitting element can be provided. Further, because the same amount of light can be extracted with smaller amount of power, a light-emitting module with reduced power consumption can be provided. Further, because unnecessary heat generation caused by power is suppressed, a light-emitting module with improved reliability can be provided.

Further, one embodiment of the present invention is the above-described light-emitting module in which the optical bonding layer contains a liquid crystal, and which includes a first alignment film which is in contact with the optical bonding layer and is provided between the light-transmitting layer and the optical bonding layer.

Furthermore, one embodiment of the present invention is the above-described light-emitting module in which the optical bonding layer contains a liquid crystal, and which includes a second alignment film which is in contact with the optical bonding layer and is provided between the optical bonding layer and the window material.

Accordingly, a difference in refractive index between the light-transmitting layer and the optical bonding layer and a difference in refractive index between the optical bonding layer and the window material can be reduced. Thus, the refractive index of at least one side of the optical bonding layer can be controlled using the alignment film. Accordingly, a light-emitting module that can efficiently extract light emitted from a light-emitting element can be provided. Further, a light-emitting module having lower power consumption can be provided. Further, a light-emitting module with improved reliability can be provided.

One embodiment of the present invention is a light-emitting device including a plurality of the above light-emitting modules.

The above-described light-emitting device of one embodiment of the present invention includes a plurality of light-emitting modules which can efficiently extract light emitted from a light-emitting element. As a result, a light-emitting module having lower power consumption or with improved reliability can be provided.

Note that in this specification, an "EL layer" refers to a layer provided between a pair of electrodes in a light-emitting element. Thus, a light-emitting layer containing an organic compound that is a light-emitting substance which is interposed between electrodes is an embodiment of the EL layer.

In this specification, in the case where a substance A is dispersed in matrix formed using a substance B, the substance B forming the matrix is referred to as a host material, and the substance A dispersed in the matrix is referred to as a guest material. Note that the substance A and the substance B may each be a single substance or a mixture of two or more kinds of substances.

Note that a light-emitting device in this specification means an image display device, a light-emitting device, or a light source (including a lighting device). In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted on a substrate over which a light-emitting element is formed by a chip on glass (COG) method.

With one embodiment of the present invention, a novel light-emitting module can be provided. A novel light-emitting device can be provided. A light-emitting module in which light emitted from a light-emitting element can be efficiently extracted can be provided. A light-emitting module having lower power consumption can be provided. A light-emitting module with improved reliability can be provided.

DETAILED DESCRIPTION OF THE INVENTION

Figure 1A:
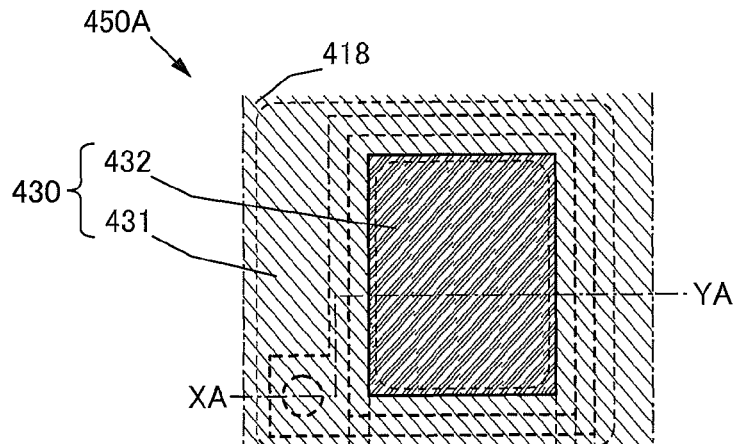
FIGS. 1A and 1B illustrate a structure of a light-emitting module according to one embodiment of the present invention.

Example of Problem Solvable by One Embodiment of Present Invention

A solid-state light-emitting element is known. The solid-state light-emitting element emits light from a region whose refractive index is higher than that of the air.

In order to efficiently extract light generated in the solid-state light-emitting element to the air, it is necessary not to satisfy the conditions for total reflection at an interface in the light path as much as possible. Specifically, the refractive index of a layer from which light generated in the solid-state light-emitting element is extracted (the layer is referred to as a light-transmitting layer in this specification) is preferably higher than or equal to the refractive index inside the solid-state light-emitting element. With this structure, light generated in the light-emitting element can efficiently enter the light-transmitting layer.

However, when the refractive index of the light-transmitting layer is higher than that of the air, the conditions for total reflection are easily satisfied at the interface between the light-transmitting layer and the air.

In order not to diffuse undesired impurities into the light-emitting element or not to apply undesired external force to the light-emitting element, a window material having a light-transmitting property or the like is provided to overlap the light extraction side of the light-emitting element, in some cases.

Even in this structure, when the refractive index of the window material is higher than that of the air, the conditions for total reflection are easily satisfied at the interface between the window material and the air.

One Embodiment of Present Invention

In order to solve the problem, a difference in refractive index between a layer through which light is extracted from a light-emitting element and a window material sealing the light-emitting element is focused. The following embodiment includes one embodiment of the present invention which is created on the basis of the structure of an optical bonding layer provided between a light-emitting element and a window material.

The light-emitting module which is one embodiment of the present invention includes a window material having a light-transmitting property, a light-emitting element that emits light toward the window material transmitted from a light-transmitting layer whose refractive index is higher than that of the window material, and an optical bonding layer between the window material and the light-transmitting layer. The optical bonding layer includes a thick part overlapping the light-emitting element and a thin part surrounding the thick part.

As a result, light emitted from the light-emitting element easily enters the optical bonding layer and the window material. Accordingly, a light-emitting module that can efficiently extract light emitted from a light-emitting element can be provided. Further, because the same amount of light can be extracted with smaller amount of power, a light-emitting module with reduced power consumption can be provided. Further, because unnecessary heat generation caused by power is suppressed, a light-emitting module with improved reliability can be provided.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

Embodiment 1

In this embodiment, a structure of the light-emitting module of one embodiment of the present invention will be described with reference to FIGS. 1A and 1B.

Figure 1B:
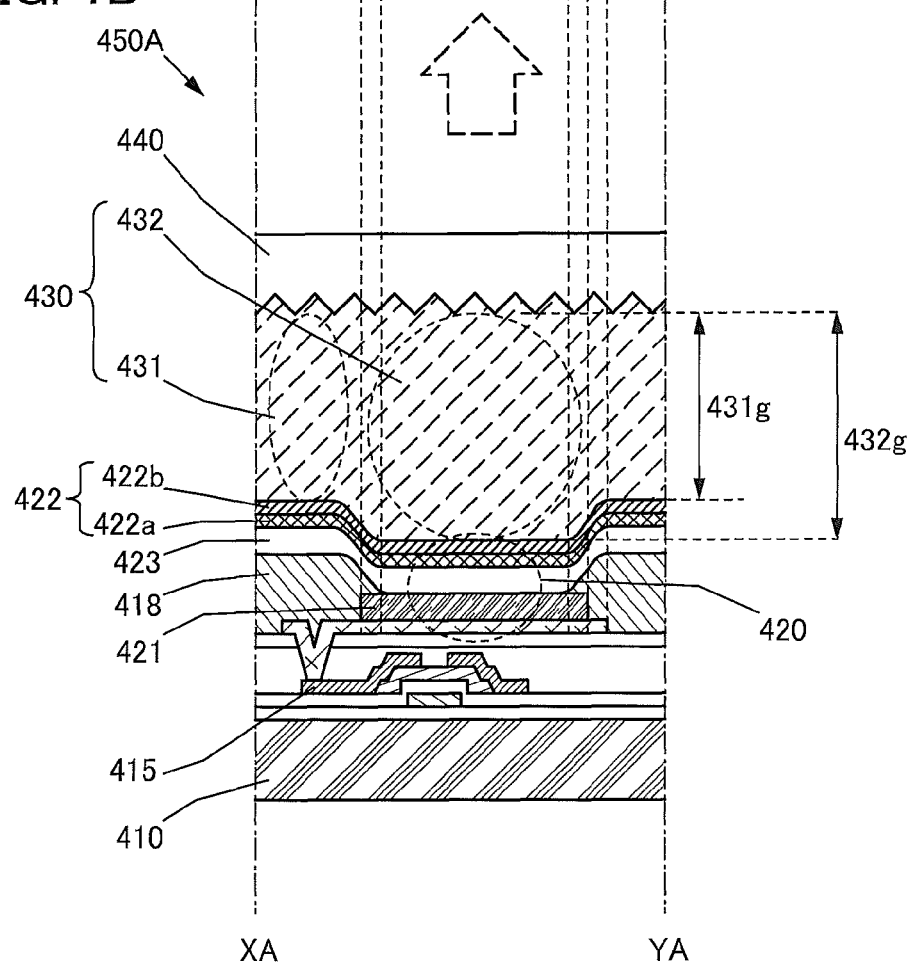

FIG. 1A is a top view of a structure of the light-emitting module of one embodiment of the present invention, and FIG. 1B is a side view of the structure of the light-emitting module along line XA-YA in FIG. 1A. Note that some of components are omitted to avoid complexity for easy understanding.

A light-emitting module 450A described in this embodiment includes a window material 440 having a light-transmitting property, a light-emitting element 420 that emits light transmitted from a light-transmitting layer 422 toward the window material 440, and an optical bonding layer 430 between the window material 440 and the light-transmitting layer 422 (see FIG. 1B).

The optical bonding layer 430 includes a thick part 432 and a thin part 431. The thick part 432 overlaps the light-emitting element 420. The thin part 431 is thinner than the thick part 432 and surrounds the thick part 432.

The light-emitting element 420 includes an upper electrode 422a, a lower electrode 421 overlapping with the upper electrode 422a, and a layer 423 containing a light-emitting organic compound between the upper electrode 422a and the lower electrode 421. Although a stacked body including the upper electrode 422a and the protective layer 422b of the light-emitting element 420 is used for the light-transmitting layer 422 as an example, the light-transmitting layer 422 may include only the upper electrode 422a.

The refractive index of the optical bonding layer 430 is higher than that of the window material 440 and higher than or equal to that of the layer 423 containing a light-emitting organic compound.

The light-emitting module 450A has a lens-like curved surface at the boundary between the thick part and the thin part of the optical bonding layer. Thus, the optical bonding layer 430 is formed to have a lens shape, which is provided along an end portion of a light-emitting region to direct light emitted from the end portion of the light-emitting region toward the window material.

In addition, because the refractive index of the optical bonding layer 430 is higher than that of the light-transmitting layer 422, light emitted from the light-emitting element 420 can be efficiently extracted from the light-transmitting layer 422. As a result, a light-emitting module that can efficiently extract light emitted from a light-emitting element can be provided. Further, because the same amount of light can be extracted with smaller amount of power, a light-emitting module with reduced power consumption can be provided. Further, because unnecessary heat generation caused by power is suppressed, a light-emitting module with improved reliability can be provided.

Note that the light-emitting module 450A includes the light-emitting element 420 over a support substrate 410. The light-emitting element 420 emits light in the direction indicated by an arrow (see FIG. 1B). A wiring 415 for supplying power to the lower electrode 421 is provided over the support substrate 410. A switching circuit for supplying power to the lower electrode 421 may be provided so as to overlap with the lower electrode 421.

The optical bonding layer 430 includes the thick part 432 and the thin part 431. A thickness 431g of the thin part 431 in a direction to which the light-emitting element 420 emits light is smaller than a thickness 432g of the thick part 432.

A partition wall 418 is composed of an opening overlapping the light-emitting element 420 and a projection along the end portion of the light-emitting element 420. Accordingly, the thin part 431 is formed between the partition wall 418 and the window material 440, and the thick part 432 overlaps the light-emitting element 420 (see FIG. 1A). The partition wall 418 has a lens-like curved surface (a curved surface whose surface is continuous and smooth) between the thick part 432 and the thin part 431 of the optical bonding layer 430. In other words, the optical bonding layer 430 is formed to have a lens shape, which is provided along the inclined surfaces of the partition wall 418. Note that it is preferable that the partition wall 418 surround the light-emitting element 420.

The partition wall 418 is provided over the support substrate 410.

Note that a partition wall may be provided on the window material 440. In this case, the thin part 431 is formed between the partition wall and the support substrate 410. Alternatively, two partition walls facing each other may be provided on the support substrate 410 side and the window material 440 side. In this case, the thin part is formed between the facing partition walls.

The light-emitting element 420 of the light-emitting module 450A described in this embodiment includes a light-emitting region of larger than or equal to 400 μm$^2$ and smaller than 3500 μm$^2$, preferably larger than or equal to 800 μm$^2$ and smaller than 1500 μm$^2$. The thin part 431 is provided along the end portion of the light-emitting region. Here, there is the area of the light-emitting region observed from the light extraction direction.

Figure 3A:
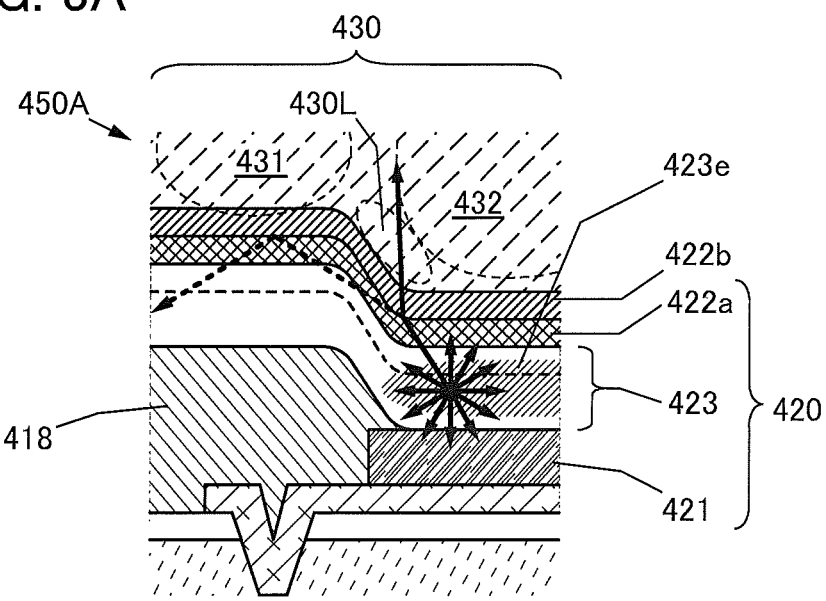
FIGS. 3A and 3B schematically illustrate the effect of a thick part and a thin part of an optical bonding layer according to one embodiment of the present invention on light.

There is light emitted from the end portion of a light-emitting region 423e and lost without going toward the window material 440 (this stray light is indicated by a dotted-line arrow in FIG. 3A). The proportion of light that is emitted from the end portion of the light-emitting region 423e and lost to total light that is emitted from the light-emitting element 420 is higher as the area of the light-emitting region 423e is small. By forming the thin part 431 along the end portion of the light-emitting region 423e of the light-emitting module 450A, a lens-shaped curved surface 430L can be formed between the thin part 431 and the thick part 432 of the optical bonding layer 430. The lens-like optical bonding layer 430 can direct light, which is emitted from the end portion of the light-emitting region 423e and might be lost, toward the window material 440 (indicated by a solid-line arrow in FIG. 3A). Consequently, the effect of increasing efficiency of extracting light from the window material becomes prominent as the area of the light-emitting region is small.

For example, the area of the light-emitting region is preferably less than 1500 μm$^2$, further preferably less than or equal to 1300 μm$^2$, still further preferably less than or equal to 1100 μm$^2$, yet still further preferably less than or equal to 1000 μm$^2$, and yet still further preferably less than or equal to 900 μm$^2$.

Thus, as the area of the light-emitting region is small, the effect of increasing efficiency of light extracted from the window material can be seen prominently. Accordingly, a light-emitting module that can efficiently extract light emitted from a light-emitting element can be provided. Further, because the same amount of light can be extracted with smaller amount of power, a light-emitting module with reduced power consumption can be provided. Further, because unnecessary heat generation caused by power is suppressed, a light-emitting module with improved reliability can be provided.

Examples of the components that can be used in the light-emitting module of one embodiment of the present invention will be described below.

<<Material for Window Material Having Light-Transmitting Property>>

The window material having light-transmitting property 440 transmits part of light emitted from the light-emitting element 420 after passing through the light-transmitting layer 422.

The window material 440 preferably prevents a phenomenon in which undesired impurities are diffused into the light-emitting element 420. For example, water vapor permeability per day is preferably lower than or equal to $1 \times 10^{-5}$ (g/m$^2$), more preferably lower than or equal to $1 \times 10^{-6}$ (g/m$^2$).

The window material 440 preferably has high rigidity to prevent a phenomenon in which undesired external force is applied to the light-emitting element 420. For example, the rigidity of the window material is preferably higher than that of the layer 423 containing a light-emitting organic compound.

The window material 440 preferably has a refractive index of higher than or equal to 1.5 and lower than or equal to 1.65.

The surface of the window material 440 may be uneven. For example, a structure for diffusing light, a moth-eye structure, or the like can be employed to form the unevenness of the window material 440. Note that when the light-emitting module is employed to a display device, it is preferable to determine the degree of the unevenness so as not to make display blur.

Examples of the structure for diffusing light include microlens, a pyramid structure, unevenness formed by sand blasting or frost processing, and the like. Alternatively, a film or the like having uneven surface may be bonded to the window material 440.

The unevenness of the surface of the window material 440 that is in contact with the optical bonding layer 430 is in contact with the optical bonding layer 430 in various angles. This makes it difficult to satisfy the conditions for total reflection. Thus, especially when the refractive index of the optical bonding layer 430 is higher than that of the light-transmitting layer 422, light can be efficiently extracted.

The unevenness on the surface of the window material 440 on the light extraction side (e.g., air) intersects with light traveling inside the window material 440 in various angles.

This makes it difficult to satisfy the conditions for causing total reflection repeatedly at two interfaces between which the window material 440 is sandwiched. As a result, light emitted from the light-emitting element 420 is efficiently extracted outside the light-emitting module 450A.

Examples of a material which can be used as the window material 440 include glass, an inorganic film, a resin plate, a resin film, or a stacked body or a complex including a plurality of materials selected from these materials.

Specifically, glass such as non-alkali glass, soda-lime glass, potash glass, or crystal glass can be used.

An inorganic film such as a metal oxide film, a metal nitride film, or a metal oxynitride film, or a stacked-layer film including a plurality of films selected from these films can be used. Specifically, silicon oxide, silicon nitride, silicon oxynitride, an alumina film, or the like can be used.

Resin such as polyester, polyolefin, polyamide, polyimide, polycarbonate, or acrylic resin, or a complex of a plurality of kinds of resin selected from these resins can be used.

The window material 440 may be formed into a plate-like shape, a film-like shape, or a lens-like shape.

<<Material for Light-Transmitting Layer>>

The light-transmitting layer 422 transmits light emitted from the light-emitting element 420 toward the window material 440.

A stacked body including the upper electrode 422a and the protective layer 422b of the light-emitting element 420 is used for the light-transmitting layer 422 of the light-emitting module 450A.

As a material of the protective layer 422b, an inorganic film, an organic film, a stacked body including these films, or the like can be used. For example, a metal oxide film, a metal nitride film, resin, or the like can be used.

Note that the light-transmitting layer 422 can serve as an upper electrode of the light-emitting element 420. In this case, the light-transmitting layer 422 has conductivity.

As a material of the conductive light-transmitting layer 422, a conductive film such as a metal oxide film or a metal film thin enough to transmit light, a stacked body including these films, or the like can be used.

For example, a film of indium tin oxide, indium zinc oxide, tin oxide, zinc oxide, zinc oxide containing aluminum or gallium, or the like; a metal oxide film containing an element of any of these films; a stacked-layer film including any of these films; or the like can be used.

For example, a metal film of silver, a magnesium-silver alloy, or the like, a stacked-layer film including any of these films, or the like can be used with a thickness of larger than or equal to 5 nm and smaller than or equal to 25 nm.

The refractive index of the light-transmitting layer 422 is preferably equivalent to the refractive index of the light-emitting region of the light-emitting element 420. For example, the refractive index of the light-transmitting layer 422 is preferably higher than or equal to 1.7 and lower than or equal to 2.1.

<<Material for Light-Emitting Element>>

The light-emitting element 420 emits light transmitted from the light-transmitting layer 422 toward the window material 440.

The light-emitting element 420 preferably includes a semiconductor layer which emits light by recombination of holes and electrons.

For example, a light-emitting diode, specifically an organic electroluminescent (also referred to as an organic EL) element can be used.

In the case where the organic EL element is used as the light-emitting element 420, the light-transmitting layer 422 serving as an upper electrode, the lower electrode 421 overlapping with the upper electrode, and the layer 423 containing a light-emitting organic compound between the upper electrode and the lower electrode 421 are included.

Note that a structure of a light-emitting element that can be applied to the light-emitting element 420 will be described in detail in Embodiment 5.

<<Material for Optical Bonding Layer>>

A material for the optical bonding layer 430 preferably has a refractive index of higher than 1.5 and lower than or equal to 3.0 with respect to light emitted from the light-emitting element 420.

For example, an organic material, a liquid-crystal material, or a polymer material can be used. Specifically, resin such as polyester, polyolefin, polyamide, polyimide, polycarbonate, or acryl resin, or a complex of a plurality of kinds of resin selected from these resins can be used.

Modification Example 1

In modification examples of this embodiment, a structure of the light-emitting device of one embodiment of the present invention will be described with reference to FIGS. 8A to 8C.

Figure 8A:
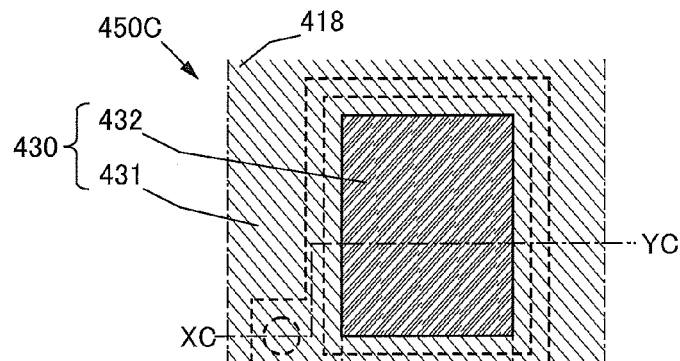
FIGS. 8A to 8C illustrate a structure of a light-emitting module according to one embodiment.
Figure 8B:
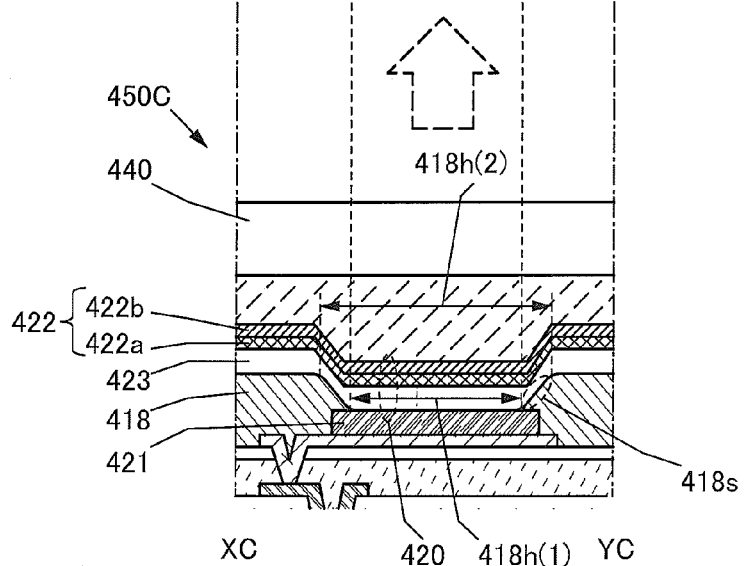

FIG. 8A is a top view of a structure of the light-emitting device of one embodiment of the present invention. FIG. 8B is a cross-sectional view taken along line XC-YC in FIG. 8A. Note that some of components are omitted to avoid complexity for easy understanding.

A light-emitting module 450C described in this embodiment includes the window material 440 having a light-transmitting property, the light-emitting element 420 that emits light transmitted from the light-transmitting layer 422 toward the window material 440, the optical bonding layer 430 between the window material 440 and the light-transmitting layer 422, and the partition wall 418 surrounding the light-emitting element 420.

The optical bonding layer 430 includes the thick part 432 and the thin part 431. The thick part 432 overlaps the light-emitting element 420. The thin part 431 is thinner than the thick part 432 and surrounds the thick part 432.

The light-emitting element 420 includes the upper electrode 422a, the lower electrode 421 overlapping with the upper electrode 422a, and the layer 423 containing a light-emitting organic compound between the upper electrode 422a and the lower electrode 421.

Note that a stacked-layer structure including the upper electrode 422a and the protective layer 422b of the light-emitting element 420 can be used as the light-transmitting layer 422.

The partition wall 418 has an opening which is widened in a direction in which the light-emitting element 420 emits light. A bottom surface of the opening is in contact with the lower electrode 421 and a side surface 418s is in contact with the layer 423 containing a light-emitting organic compound. The refractive index of the partition wall 418 is lower than that of the layer 423 containing a light-emitting organic compound.

Because the partition wall 418 has the refractive index n(D) which is lower than the refractive index n(EL) of the layer 423 containing a light-emitting organic compound, light emitted from the light-emitting region 423e of the layer 423 containing a light-emitting organic compound is difficult to enter the inside of the partition wall 418. Further, because the partition wall 418 has the opening which is widened in a direction in which the light-emitting element 420 emits light, light reflected by the side surface 418s of the opening is directed to the window material 440.

Accordingly, a light-emitting module that can efficiently extract light emitted from a light-emitting element can be provided. Further, because the same amount of light can be extracted with smaller amount of power, a light-emitting module with reduced power consumption can be provided. Further, because unnecessary heat generation caused by power is suppressed, a light-emitting module with improved reliability can be provided.

The shape of the opening of the partition wall 418 will be described with reference to the cross section of FIG. 8B. In the cross section of the opening, a length 418h(2) on the window material 440 side is longer than a length 418h(1) on the lower electrode 421 side; the side surfaces of the opening of the partition wall 418 are tapered.

Figure 8C:
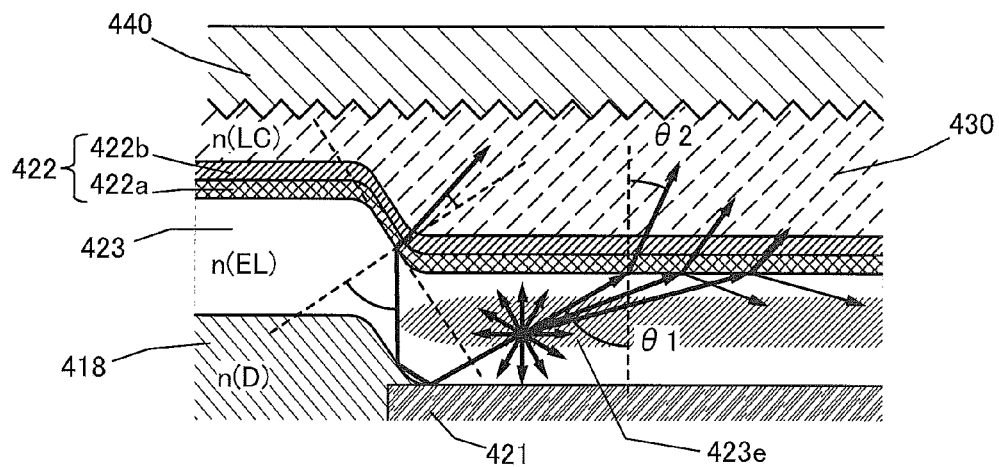

The higher the refractive index n(LC) of the optical bonding layer 430 on the light-transmitting layer 422 is, the more efficiently light emitted from the light-emitting element 420 can be extracted (see FIG. 8C). In particular, when the optical bonding layer 430 has higher refractive index than that of the light-transmitting layer 422, light incident on the light-transmitting layer 422 at an angle θ1 travels to the optical bonding layer 430 at an angle θ2 which is smaller than the angle θ1. In addition, the refractive index n(LC) of the optical bonding layer 430 is preferably higher than a refractive index n(D) of the partition wall 418.

The side surfaces of the partition wall 418 are in contact with the layer 423 containing an organic compound. Part of light emitted from the layer 423 containing an organic compound enters the partition wall 418. As a result, part of the light may stray and cannot be extracted to outside, in some cases.

In contrast, the refractive index n(D) of the partition wall 418 is low, so that light emitted from the layer 423 containing a light-emitting organic compound can be guided toward the layer 423 containing a light-emitting organic compound. Note that as a material preferably used for the partition wall 418, a material having a refractive index of higher than or equal to 1.5 and lower than or equal to 1.7 can be given.

In particular, light incident from the layer 423 containing a light-emitting organic compound on the upper electrode 422a in an oblique direction can be extracted efficiently. Note that as a material preferably used for the layer 423 containing a light-emitting organic compound, a material having a refractive index of higher than or equal to 1.65 and lower than or equal to 1.9 can be given.

Modification Example 2

Another modification example of this embodiment has the same structure as the light-emitting module described with reference to FIGS. 1A and 1B, except that the window material has a refractive index of higher than or equal to 1.5 and lower than or equal to 1.65, and the optical bonding layer 430 has a refractive index of higher than 1.5 and lower than or equal to 3.0. Thus, the structure of another modification example will be described with reference to FIGS. 1A and 1B.

The light-emitting module includes the window material 440 having a light-transmitting property, the light-emitting element 420 that emits light transmitted from the light-transmitting layer 422 toward the window material 440, and the optical bonding layer 430 between the window material 440 and the light-transmitting layer 422.

The optical bonding layer 430 includes the thick part 432 and the thin part 431. The thick part 432 overlaps the light-emitting element 420. The thin part 431 is thinner than the thick part 432 and surrounds the thick part 432.

The light-emitting element 420 includes the upper electrode 422a, the lower electrode 421 overlapping with the upper electrode 422a, and the layer 423 containing a light-emitting organic compound between the upper electrode 422a and the lower electrode 421.

The window material has a refractive index of higher than or equal to 1.5 and lower than or equal to 1.65, the light-transmitting layer 422 has a refractive index of higher than or equal to 1.7 and lower than or equal to 2.1, and the optical bonding layer 430 has a refractive index of higher than 1.5 and lower than or equal to 3.0.

As a result, light emitted from the light-emitting element 420 easily enters the optical bonding layer 430 and the window material 440. Accordingly, a light-emitting module that can efficiently extract light emitted from a light-emitting element can be provided. Further, because the same amount of light can be extracted with smaller amount of power, a light-emitting module with reduced power consumption can be provided. Further, because unnecessary heat generation caused by power is suppressed, a light-emitting module with improved reliability can be provided.

This embodiment can be combined with any of the other embodiments in this specification as appropriate.

Embodiment 2

In this embodiment, a structure of a light-emitting module of one embodiment of the present invention will be described with reference to FIGS. 2A and 2B.

Figure 2A:
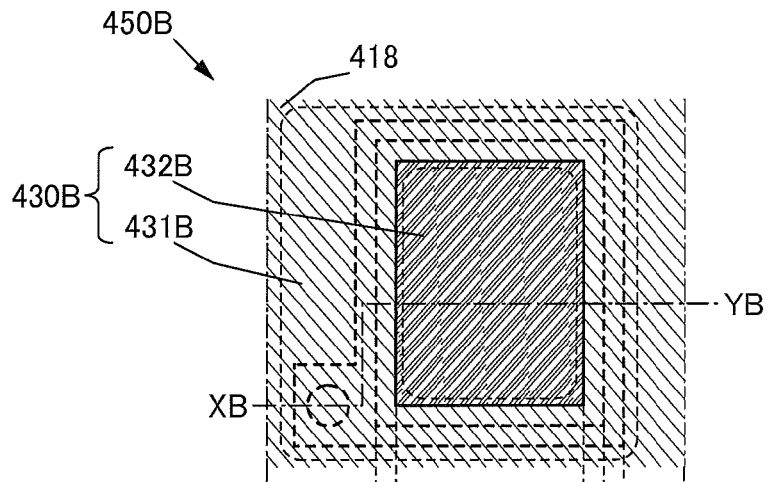
FIGS. 2A and 2B illustrate a structure of a light-emitting module according to one embodiment.
Figure 2B:
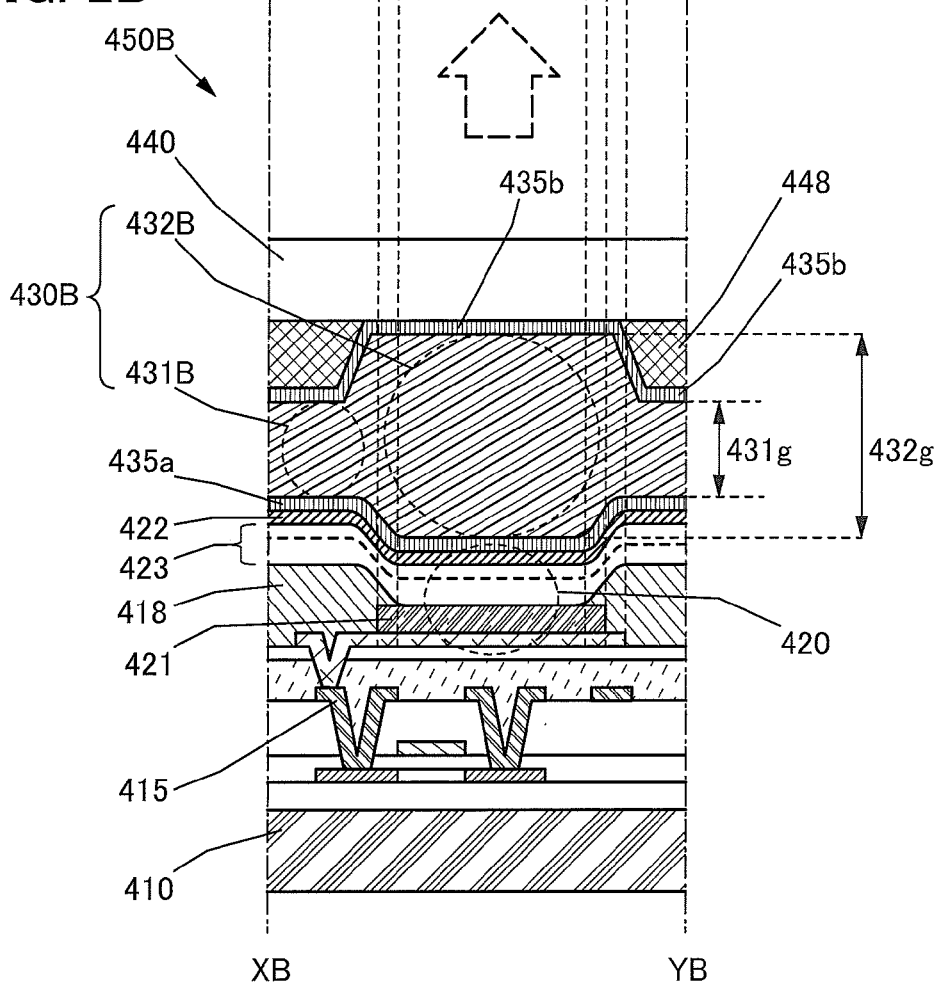

FIG. 2A is a top view of a structure of the light-emitting module of one embodiment of the present invention, and FIG. 2B is a side view of the structure of the light-emitting module along line XB-YB in FIG. 2A. Note that some of components are omitted to avoid complexity for easy understanding.

A light-emitting module 450B described in this embodiment includes the window material 440 having a light-transmitting property, the light-emitting element 420 that emits light transmitted from a light-transmitting layer 422 toward the window material 440, and the optical bonding layer 430B between the window material 440 and the light-transmitting layer 422 (see FIG. 2B).

The optical bonding layer 430B includes a thick part 432B and a thin part 431B. The thick part 432B overlaps the light-emitting element 420. The thin part 431B is thinner than the thick part 432B and surrounds the thick part 432B.

The light-emitting module includes the optical bonding layer 430B whose refractive index is lower than that of the light-transmitting layer 422 and higher than that of the window material 440 and which contains a birefringence material in which the refractive index is reduced toward the window material 440 side.

Thus, the optical bonding layer 430B is formed to have a lens shape, which is provided along an end portion of a light-emitting region to direct light emitted from the end portion of the light-emitting region toward the window material 440. In addition, light emitted from the light-emitting element 420 easily enters the optical bonding layer 430B and the window material 440. Accordingly, a light-emitting module that can efficiently extract light emitted from a light-emitting element can be provided. Further, because the same amount of light can be extracted with smaller amount of power, a light-emitting module with reduced power consumption can be provided. Further, because unnecessary heat generation caused by power is suppressed, a light-emitting module with improved reliability can be provided.

The light-emitting element 420 of the light-emitting module 450B described in this embodiment includes a light-emitting region of larger than or equal to 400 $\mu m^2$ and smaller than 3500 $\mu m^2$, preferably larger than or equal to 800 $\mu m^2$ and smaller than 1500 $\mu m^2$. The thin part 431B is provided along the end portion of the light-emitting region.

Figure 3B:
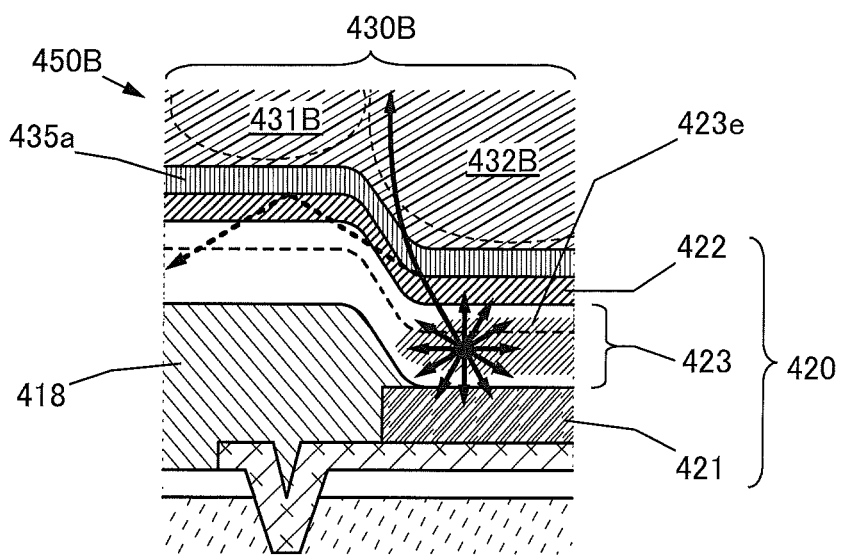

There is light emitted from the end portion of a light-emitting region 423e and lost without going toward the window material 440 (this stray light is indicated by a dotted-line arrow in FIG. 3B). The proportion of light that is emitted from the end portion of the light-emitting region 423e and lost to total light that is emitted from the light-emitting element 420 is higher as the area of the light-emitting region 423e is small. By forming the thin part 431B along the end portion of the light-emitting region 423e of the light-emitting module 450B, a lens-shaped curved surface can be formed between the thin part 431B and the thick part 432B of the optical bonding layer 430B. The lens-like optical bonding layer 430B can direct light, which is emitted from the end portion of the light-emitting region 423e and might be lost, toward the window material 440 (indicated by a solid-line arrow in FIG. 3B). Consequently, the effect of increasing efficiency of extracting light from the window material becomes prominent as the area of the light-emitting region is small.

In addition, the orientation of the birefringence material contained in the optical bonding layer 430B is controlled by the partition wall 418 and/or the partition wall 448. Thus, a region whose refractive index changes is formed at the boundary between the thick part 432B and the thin part 431B of the optical bonding layer, so that light which is emitted from the end portion of the light-emitting region and might be lost can be directed toward the window material.

Consequently, the effect of increasing efficiency of extracting light from the window material becomes prominent as the area of the light-emitting region is small. Accordingly, a light-emitting module that can efficiently extract light emitted from a light-emitting element can be provided. Further, because the same amount of light can be extracted with smaller amount of power, a light-emitting module with reduced power consumption can be provided. Further, because unnecessary heat generation caused by power is suppressed, a light-emitting module with improved reliability can be provided.

The light-emitting module 450B described in this embodiment has the same structure as the light-emitting module 450A described in Embodiment 1, except that the optical bonding layer 430B containing a liquid crystal, a first alignment film 435a, and a second alignment film 435b are included (see FIGS. 1B and 2B).

In this embodiment, the optical bonding layer 430B containing a liquid crystal, the first alignment film 435a, and the second alignment film 435b will be described in details, and the description in Embodiment 1 can be referred to for the other structures.

The optical bonding layer 430B of the light-emitting module 450B contains a birefringence liquid crystal with a refractive index lower than or equal to 1.65 and a refractive index higher than or equal to 1.75.

Thus, the refractive index of the optical bonding layer 430B being in contact with the second alignment film 435b can differ from the refractive index of the optical bonding layer 430B being in contact with the first alignment film 435a.

In addition, the orientation of liquid crystals contained in the optical bonding layer 430B is controlled by the partition wall 418 and/or the partition wall 448 serving as a rib. Thus, a region whose refractive index continuously changes is formed at the boundary between the thick part 432B and the thin part 431B of the optical bonding layer, so that light which is emitted from the end portion of the light-emitting region and might be lost can be directed toward the window material.

Accordingly, a light-emitting module that can efficiently extract light emitted from a light-emitting element can be provided. Further, a light-emitting module having lower power consumption can be provided. Further, a light-emitting module with improved reliability can be provided.

In the light-emitting module 450B, the optical bonding layer 430B contains a liquid crystal, and the first alignment film 435a being in contact with the optical bonding layer 430B is provided between the light-transmitting layer 422 and the optical bonding layer 430B.

The first alignment film 435a controls orientation of a liquid crystal contained in the optical bonding layer 430B on the light-transmitting layer 422 side so that a difference between the refractive index of the optical bonding layer 430B and the refractive index of the light-transmitting layer 422 by 0.5 or lower.

In the light-emitting module 450B, the optical bonding layer 430B contains a liquid crystal, and the second alignment film 435b being in contact with the optical bonding layer 430B is provided between the optical bonding layer 430B and the window material 440.

The second alignment film 435b controls orientation of a liquid crystal contained in the optical bonding layer 430B on the window material 440 side so that a difference between the refractive index of the optical bonding layer 430B and the refractive index of the window material 440 by 0.5 or lower.

In addition, a liquid crystal contained in the optical bonding layer 430B sandwiched between the first and second alignment films 435a and 435b is oriented so that the refractive index of the optical bonding layer 430B is gradually reduced from the light-transmitting layer 422 toward the window material 440.

Thus, the refractive index of at least one side of the optical bonding layer 430B can be controlled using the alignment films. As a result, a light-emitting module which can efficiently extract light emitted from a light-emitting element can be provided easily with high yield. Further, a light-emitting module having lower power consumption can be provided. Further, a light-emitting module with improved reliability can be provided.

Examples of the components that can be used in the light-emitting module of one embodiment of the present invention will be described below.

<<Birefringence Material>>

As a birefringence material which can be used for the optical bonding layer 430B, a birefringence material having a refractive index lower than or equal to 1.65 and a refractive index higher than or equal to 1.75 with respect to light emitted from the light-emitting element 420 is preferable. For example, resin or a liquid crystal can be used.

Nematic liquid crystal, cholesteric liquid crystal, smectic liquid crystal, discotic liquid crystal, thermotropic liquid crystal, lyotropic liquid crystal, low-molecular liquid crystal, high-molecular liquid crystal, polymer dispersed liquid crystal (PDLC), ferroelectric liquid crystal, anti-ferroelectric liquid crystal, main-chain liquid crystal, side-chain high-molecular liquid crystal, banana-shaped liquid crystal, or a mixed material of any of these liquid crystals and a chiral agent or the like can be used.

<<Alignment Film>>

A film which can be used to the first alignment film 435a or the second alignment film 435b orients a birefringence material. For example, a film having a polarity on its surface, a film including a substituent having a polarity on its surface, a film including a stereostructure on its surface, a film including a regular stereostructure on its surface, or the like can be used.

For example, a film which can control the orientation of a birefringence material by rubbing can be used. Specifically, an alignment film such as a polyimide film containing a hydrophobic substituent can be used. Note that as the hydrophobic substituent, an alkyl group, a substituent containing fluorine, and the like can be given.

A film which can control the orientation of a birefringence material by light irradiation from a given direction can be used. Specifically, an alignment film such as a polyimide film containing an azobenzene derivative, poly(vinyl cinnamate), or the like can be used.

A film in which a material vapor-deposited from a given direction can control the orientation of a birefringence material can be used. Specifically, a vapor-deposited film of silicon oxide or the like can be used.

In particular, a resin material of polyimide, polyimide amid, polyamic acid, acrylic, or the like is preferably used.

This embodiment can be combined with any of the other embodiments in this specification as appropriate.

Embodiment 3

In this embodiment, a structure of a light-emitting device of one embodiment of the present invention will be described with reference to FIGS. 4A and 4B.

Figure 4A:
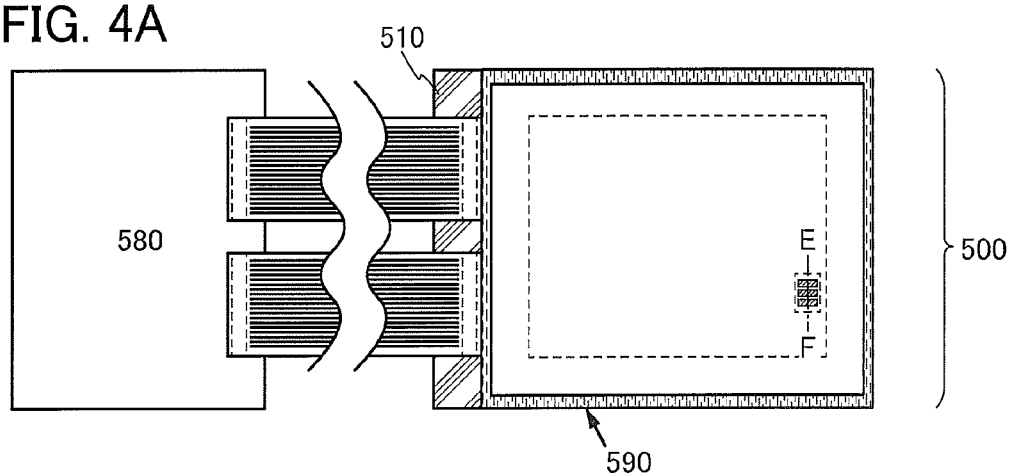
FIGS. 4A and 4B illustrate a light-emitting device according to one embodiment.
Figure 4B:
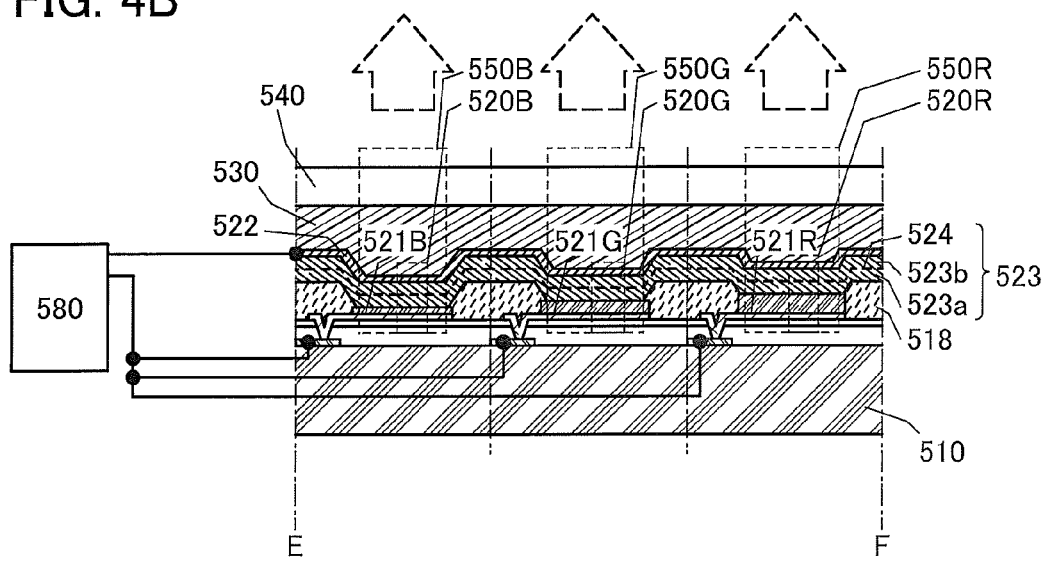

FIG. 4A is a top view of the structure of the light-emitting device of one embodiment of the present invention, and FIG. 4B is a side view of the structure of the light-emitting device along line E-F in FIG. 4A. Note that some of components are omitted to avoid complexity for easy understanding.

<Light-Emitting Device>

A light-emitting device 500 described in this embodiment includes a plurality of light-emitting modules described in Embodiment 1 or 2.

The light-emitting device 500 includes a plurality of light-emitting modules (e.g., the light-emitting modules 550B, 550G, and 550R) which can efficiently extract light emitted from a light-emitting element. As a result, a light-emitting module having lower power consumption or with improved reliability can be provided.

The light-emitting device 500 includes a plurality of adjacent light-emitting modules (the light-emitting modules 550B, 550G, and 550R) and a driver circuit 580 for driving the light-emitting modules.

The driver circuit 580 can drive the plurality of light-emitting modules. For example, the driver circuit 580 can supply a steady-state current.

<Structure of Light-Emitting Module>

The light-emitting module (the light-emitting module 550B, 550G, or 550R) includes a support substrate 510, a window material 540, an optical bonding layer 530, and a partition wall 518. For the structure of the light-emitting module, the description in Embodiment 1 or 2 can be referred to.

The light-emitting modules (the light-emitting modules 550B, 550G, and 550R) include light-emitting elements (light-emitting elements 520B, 520G, and 520R), respectively.

The light-emitting elements (the light-emitting elements 520B, 520G, and 520R) include lower electrodes (lower electrodes 521B, 521G, and 521R) which reflect visible light, respectively, and each include a light-transmitting layer 522 serving as an upper electrode, two light-emitting units (light-emitting units 523a and 523b) between the lower electrodes and the light-transmitting layer 522, and an interlayer 524 between the light-emitting units.

The light-transmitting layer 522 serving as an upper electrode is a continuous electrode and overlaps a plurality of lower electrodes. Note that the light-transmitting layer 522 serving as an upper electrode may be divided into a plurality of parts, and the divided upper electrodes may each overlap one or a plurality of lower electrodes.

The layer 523 containing a light-emitting organic compound includes the light-emitting units (the light-emitting units 523a and 523b) and the interlayer 524 sandwiched between the light-emitting units (the light-emitting units 523a and 523b).

The partition wall 518 is provided between adjacent light-emitting elements. The partition wall 518 has an insulating property and includes an opening overlapping with the lower electrode, so that the thick part and the thin part are formed in the optical bonding layer 530.

Modification Example

In a modification example of this embodiment, a structure of a light-emitting device of one embodiment of the present invention will be described with reference to FIGS. 5A to 5C.

Figure 5A:
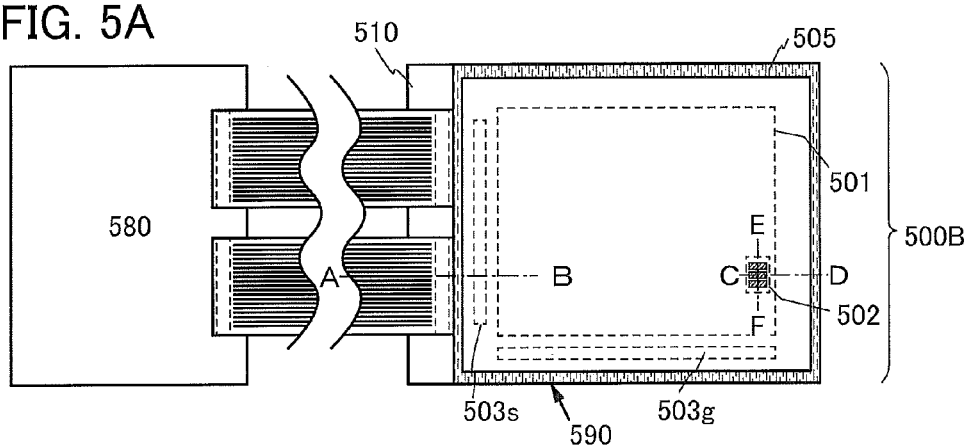
FIGS. 5A to 5C illustrate a light-emitting device according to an embodiment.
Figure 5B:
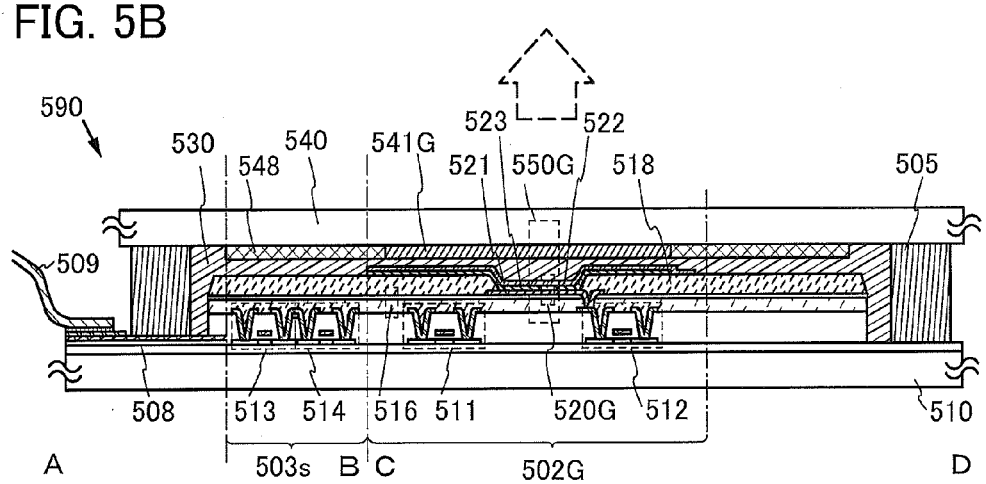

FIG. 5B is a cross-sectional side view of the structure of the light-emitting device taken along lines A-B and C-D in FIG. 5A. FIG. 5C is a cross-sectional view taken along line E-F in FIG. 5A. Note that some of components are omitted to avoid complexity for easy understanding.

A light-emitting device 500B which is a modification example described in this embodiment includes a plurality of light-emitting modules described in Embodiment 1 or 2. Note that a light-emitting panel 590 is a panel in which a plurality of light-emitting module including light-emitting elements is provided over one support substrate 510. Note that a flexible material can be used for the support substrate 510 and the window material 540, and a fluid material can be used for the optical bonding layer 530. In this case, a flexible light-emitting device which can be curved along a curved surface or twisted around a curved surface can be provided.

The light-emitting device 500E includes a light-emitting module (e.g., the light-emitting module 550G) in which a layer (e.g., a color filter 541G) which easily transmits light of a specific wavelength than light with other wavelengths is provided on the light extraction side of a light-emitting element (e.g., the light-emitting element 520G).

<<Structure of Light-Emitting Panel>>

The light-emitting panel 590 includes the support substrate 510 and a display portion 501 over the support substrate 510. The display portion 501 includes a plurality of pixels 502 arranged in a matrix (FIG. 5A).

A plurality of sub-pixels (e.g., three sub-pixels) is included in the pixel 502. Note that each sub-pixel includes a light-emitting module and a pixel circuit. The light-emitting module includes a light-emitting element which is electrically connected to the pixel circuit.

The panel 590 is provided with a leading wiring 508. The leading wiring 508 can supply a signal input from an external input terminal to the display portion 501 (FIG. 5B).

The light-emitting panel 590 is provided with the external input terminal to which an FPC (flexible printed circuit) 509 is electrically connected. The FPC 509 can supply an image signal, a synchronization signal, and the like to the external input terminal.

The light-emitting panel 590 displays images by emitting light in an arrow direction (i.e., on the window material 540 side) in FIG. 5B.

The light-emitting panel 590 includes the support substrate 510 over which the display portion 501 and part of a driver circuit are provided. Specifically, a source driver circuit portion 503s and a gate driver circuit portion 503g are provided.

The source driver circuit portion 503s can be formed using a CMOS circuit that includes an n-channel transistor 513 and a p-channel transistor 514. Alternatively, the driver circuit may be formed using any of a variety of CMOS circuits, PMOS circuits, and NMOS circuits.

<<1. Sealed Structure>>

A sealant 505 bonds the support substrate 510 of the light-emitting panel 590 to the window material 540. A light-emitting element (e.g., the light-emitting element 520G) is sealed in a region surrounded by the support substrate 510, the window material 540, and the sealant 505.

The optical bonding layer 530 is provided between a light-transmitting layer 522 to which a light-emitting element emits light and the window material 540. Note that an adsorbent (e.g., a dry agent) for adsorbing impurities (typically water and/or oxygen) may be provided between the support substrate 510 and the window material 540.

The support substrate 510, the window material 540, and the sealant 505 are desirably formed using a material which transmits impurities in the air (typically water and/or oxygen) as little as possible. An epoxy-based resin, glass frit, or the like can be used for the sealant 505.

<<2. Pixel Structure>>

The structure of the pixel 502 will be described with reference to FIGS. 5B and 5C.

The pixel 502 includes a sub-pixel 502B emitting blue light B, a sub-pixel 502G emitting green light G, and a sub-pixel 502R emitting red light R.

Each sub-pixel includes a driver circuit and a light-emitting module.

The pixel circuit is formed over the support substrate 510.

The sub-pixel 502G includes the light-emitting module 550G, a pixel circuit including a transistor 511 which can be used for switching and a transistor 512 which can be used for current control. The partition wall 518 may be formed over the transistor 511 and the like, together with the insulating layer 516.

Any of a variety of semiconductors can be used for a region where a channel of a transistor is formed. For example, an amorphous semiconductor, a polycrystalline semiconductor, a single crystal semiconductor, or the like can be used. Specifically, amorphous silicon, polysilicon, single crystal silicon, an oxide semiconductor, or the like can be used.

The insulating layer 516 has an insulating property and can be a single layer or a stack including a plurality of layers. Note that a material capable of planarizing a step caused by the structures of the transistor 511 and the like, or a material capable of suppressing impurity diffusion into the transistor 511 and the like can be used for the insulating layer 516.

<<3. Light-Emitting Module>>

Figure 5C:
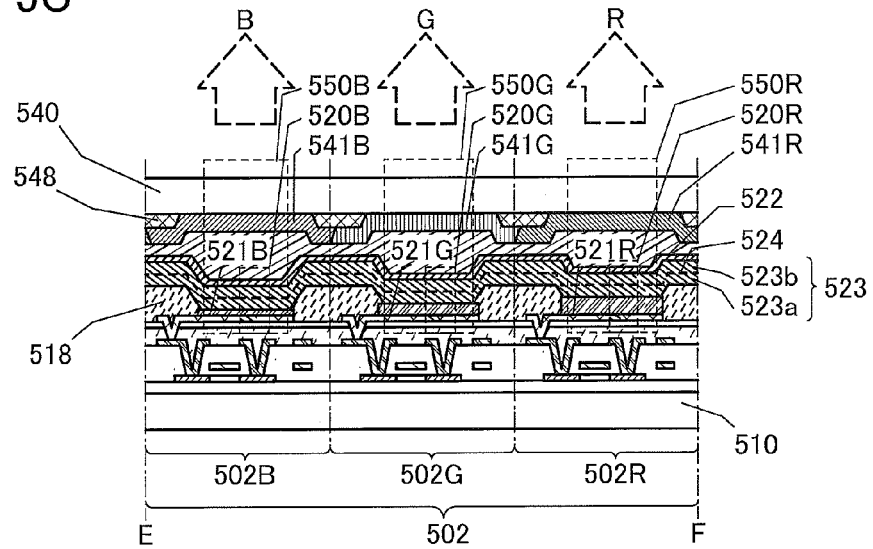

The light-emitting panel 590 includes a light-emitting module (FIG. 5C).

The light-emitting module may include, in addition to a light-emitting element, an optical element such as a microresonator (also referred to as microcavity) or a color filter.

By providing a microresonator in the light-emitting module, light of a specific wavelength can be efficiently extracted from light emitted from the light-emitting element. Further, by providing a color filter in the light-emitting module, unnecessary light can be absorbed.

<<3.1. Microresonator>>

A microresonator is composed of a reflective film, a semi-transmissive and semi-reflective film, and an optical adjustment layer between the reflective film and the semi-transmissive and semi-reflective film.

When a light-emitting element is provided between the microresonators, light of a specific wavelength can be efficiently extracted through the semi-transmissive and semi-reflective film.

The optical adjustment layer adjusts the distance between the reflective film and the semi-transmissive and semi-reflective film. By adjusting the optical adjustment layer, the wavelength of light extracted from the microresonator can be controlled.

A conductive film having light-transmitting property with respect to visible light or a layer containing a light-emitting organic compound can be employed for a material that can be used for the optical adjustment layer.

In the light-emitting element of the light-emitting panel 590, a lower electrode and an upper electrode also serve as a reflective film and a semi-transmissive and semi-reflective film, respectively.

Note that a stacked-layer film including a reflective film and a conductive film having a light-transmitting property with respect to visible light may be used as the lower electrode so that the lower electrode also serves as a reflective film and an optical adjustment layer.

The light-emitting elements 520B, 520G, and 520R include a common upper electrode. Note that the upper electrode is a semi-transmissive and semi-reflective film and serves as the light-transmitting layer 522 of the light-emitting modules 550B, 550G, and 550R.

<<3.2. Light-Emitting Element>>

In each of the light-emitting elements 520B, 520G, and 520R, the first light-emitting unit 523a and the second light-emitting unit 523b are included between the lower electrode and the upper electrode, and the interlayer 524 is included between the first light-emitting unit 523a and the second light-emitting unit 523b.

Note that the structure of the light-emitting element will be described in detail in Embodiment 4.

<<3.3. Partition Wall>>

The partition wall 518 is provided between adjacent light-emitting elements. The partition wall 518 is an insulating layer which covers the end portions of the lower electrodes 521B, 521G, and 521R and has opening portions overlapping with these lower electrodes.

The partition wall 518 has a curved surface with curvature at a lower end portion thereof. As a material of the partition wall 518, a positive or negative photosensitive resin can be used.

Note that using a material absorbing visible light for the partition produces an effect of suppressing light leakage from a light-emitting element into its adjacent light-emitting element (also called optical crosstalk).

The partition wall functions as a rib and orients a material having birefringence contained in the optical bonding layer 530.

3.4. Color Filter>>

A color filter (e.g., the color filter 541G) is provided on the side from which light emitted from a light-emitting element (e.g., the light-emitting element 520G) is extracted.

The optical bonding layer 530 has a thick part and a thin part formed because of a partition wall 548. The thick part and the thin part overlap the light-emitting element and the partition wall 518, respectively. The partition wall 548 may be colored. The colored partition wall 548 can prevent reflection of light from outside by the light-emitting panel 590 and has an effect of increasing the contrast of images displayed on the display portion 501. Note that the color filter and the partition wall 548 are formed on the window material 540.

<<3.5. Anti-Reflective Film>>

When light from outside enters the light-emitting panel 590 from the user's side, an electrode included in the light-emitting element 520G and the like reflects the external light. Consequently, light emitted from the light-emitting element 520G and the like cannot be seen clearly. In order to prevent this, an anti-reflective film is provided on the user's side of the window material 540. As the anti-reflective film, a circularly polarizing plate can be used, for example. However, the circularly polarizing plate absorbs part of light emitted from the light-emitting element, in some cases.

The light-emitting module of one embodiment of the present invention can improve light extraction efficiency of light from the light-emitting element. Thus, loss of light by the anti-reflective film and the like can be partly compensated.

<<4. Touch Sensor>>

Note that a touch sensor may be formed on the window material 540.

The touch sensor can be provided on the window material 540 side facing the light-emitting element (e.g., the light-emitting element 520G). In this case, the touch sensor and the color filter can be formed in successive processes.

Note that the touch sensor may be formed between the color filter and the window material 540 or over the color filter. Further, a transparent conductive film included in the touch sensor and a wiring found over the support substrate 510 may be connected through conductive microparticles.

Alternatively, the touch sensor may be provided on the window material 540 side, which is not facing the light-emitting element and connected to an FPC through conductive microparticles. In this case, a signal of the touch sensor can be supplied to the FPC without passing through the wiring formed over the support substrate 510.

With this structure, the FPC connected to the support substrate 510 can be displaced with the FPC connected to the window material 540, so that extra space is generated and leading of the FPC and connection with an external circuit become easy.

Further, a touch sensor formed on a substrate other than the window material 540 and the support substrate 510 and overlapped with the light-emitting panel 590 can be used.

This embodiment can be combined with any of the other embodiments in this specification as appropriate.

Embodiment 4

In this embodiment, a method for manufacturing a light-emitting module of one embodiment of the present invention will be described with reference to FIGS. 9A to 9D.

FIGS. 9A to 9D are schematic views describing a method for manufacturing a light-emitting device 500C. A top schematic view is shown on the right and a cross-sectional schematic view along line XD-YD is shown on the left of each of FIGS. 9A to 9C. Note that some of components are omitted to avoid complexity for easy understanding.

<First Step>

Figure 9A:
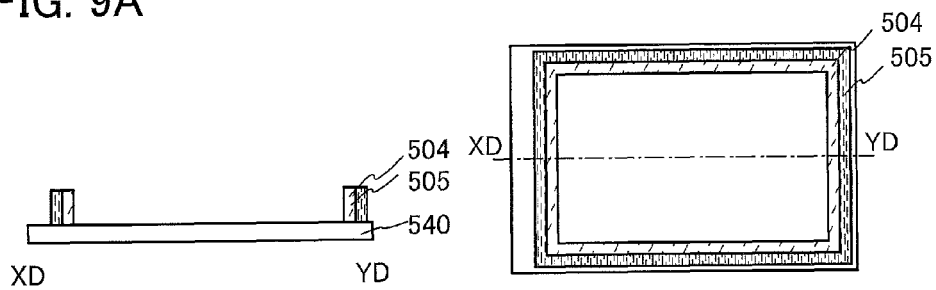
FIGS. 9A to 9D are schematic views showing a method for manufacturing a light-emitting device of one embodiment.

A frame 504 and the sealant 505 surrounding the frame 504 are formed over the window material 540 (see FIG. 9A).

The frame 504 can be formed in such a way that a photoresist, an acrylic resin, a polyimide, or the like is processed by photolithography, for example. Alternatively, an inkjet method or a dispensing method can be used for the formation.

In the case where glass frit is used for the sealant 505, a dispersion liquid of glass frit is applied by a printing method such as silk screen printing, a dispenser method, or the like and is pre-baked using a semiconductor laser or the like to form the sealant 505.

When a curable resin (such as an epoxy resin or a silicone resin) is used, for example, a dispensing method or the like is used to form the sealant 505.

<Second Step>

Figure 9B:
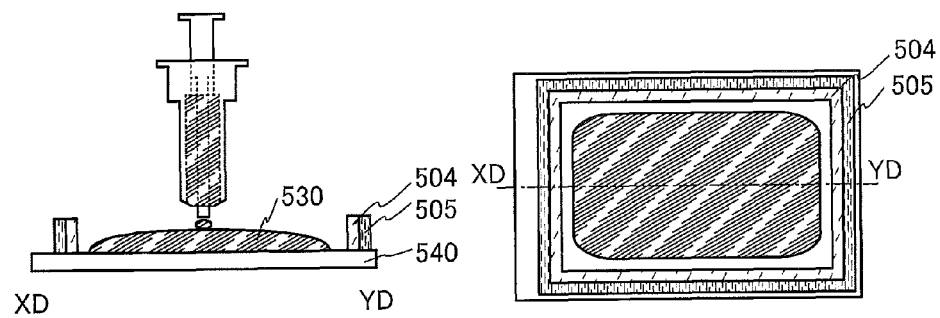
Figure 9C:
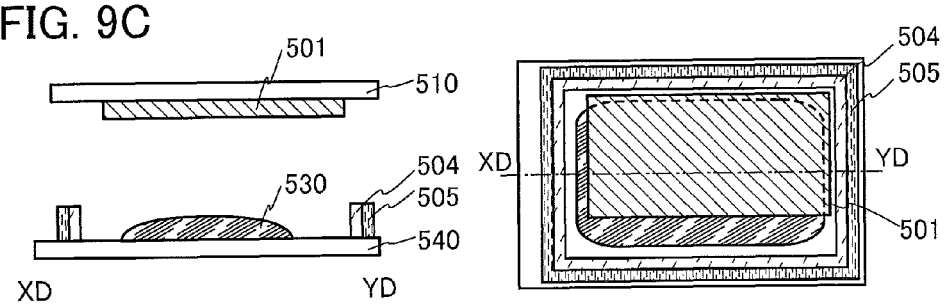
Figure 9D:
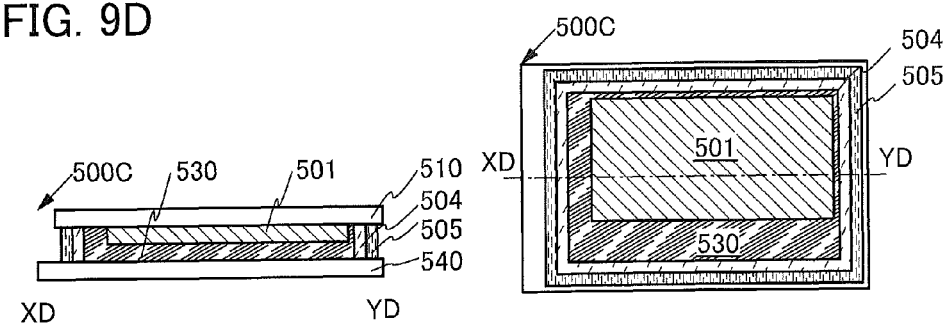

By a dropping method, the optical bonding layer 530 having fluidity is formed in a region surrounded by the frame 504 (see FIG. 9B). The optical bonding layer 530 can be formed with a manufacturing apparatus employing a one drop fill (ODF) method, which is used for manufacture of liquid crystal display devices, for example. When a manufacturing apparatus employing an ODF method is used, the distance between the support substrate and the window material 540 can be reduced. Furthermore, manufacturing time for a large light-emitting device can be reduced.

Alternatively, the optical bonding layer 530 can be thrust using a bar. In that case, a material having high viscosity can be dropped.

Alternatively, a potting device can be used.

<Third Step>

The support substrate 510 provided with the display portion 501 including a light-emitting element is prepared. Then, the support substrate 510 and the window material 540 are positioned so that the light-emitting element is in contact with the optical bonding layer 530 (see FIG. 9C).

Note that a method for forming the light-emitting element is not particularly limited. For example, a non-alkali glass substrate over which a pixel circuit is formed is used as a support substrate, and a reflective conductive film (e.g., a stacked-layer film including a Ni—Al—La alloy and a Ti thin film) is deposited by sputtering.

An island-shaped conductive film electrically connected to the pixel circuit and a common wiring to which a second electrode is electrically connected later are formed by photolithography.

An insulating partition wall having an opening portion is formed over the island-shaped conductive film. Note that the conductive film exposed in the opening portion serves as a lower electrode.

A layer containing a light-emitting organic compound is formed over the lower electrode. An upper electrode is formed to overlap the lower electrode so that the layer containing a light-emitting organic compound is sandwiched therebetween. Note that the upper electrode is electrically connected to the common wiring.

<Fourth Step>

The window material 540 and the support substrate 510 are sealed with the sealant 505. Thus, the light-emitting element is sealed in a region surrounded by the window material 540, the support substrate 510, and the sealant 505. In addition, the optical bonding layer 530 bonds the light-emitting element and the window material 540 optically.

A method for the bonding depends on a material used for the sealant 505. For example, in the case of using a curable resin (such as an epoxy resin or a silicone resin), ultraviolet rays are applied when the resin is an ultraviolet curable resin and heat is applied when the resin is a thermosetting resin.

In the case of using glass frit, for example, irradiation of a laser beam whose wavelength is absorbed by the glass frit is performed from the window material 540 side to melt the glass frit, so that the window material 540 and the support substrate are fused together.

Modification Example

In this modification example of one embodiment, a modification example of a method for manufacturing a light-emitting module will be described with reference to FIGS. 12A to 12C.

Figure 12A:
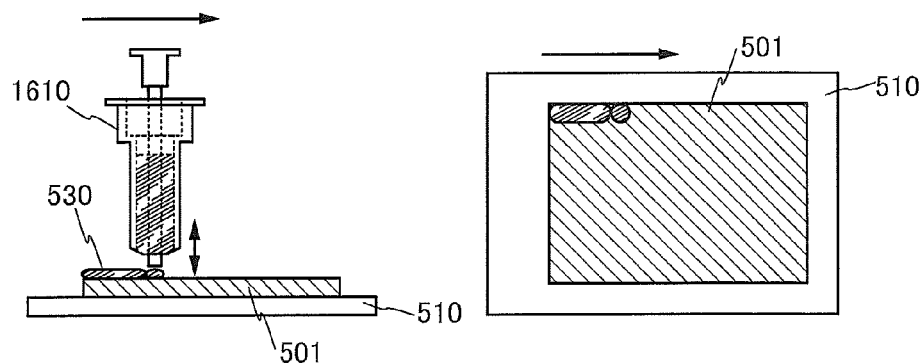
FIGS. 12A to 12C are schematic views illustrating a manufacturing method of a light-emitting device of an embodiment.
Figure 12B:
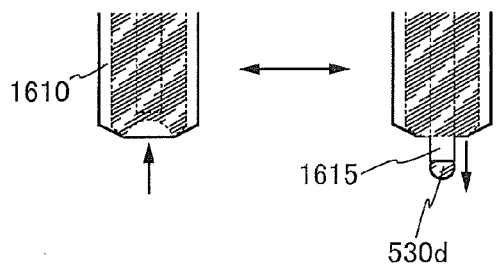
Figure 12C:
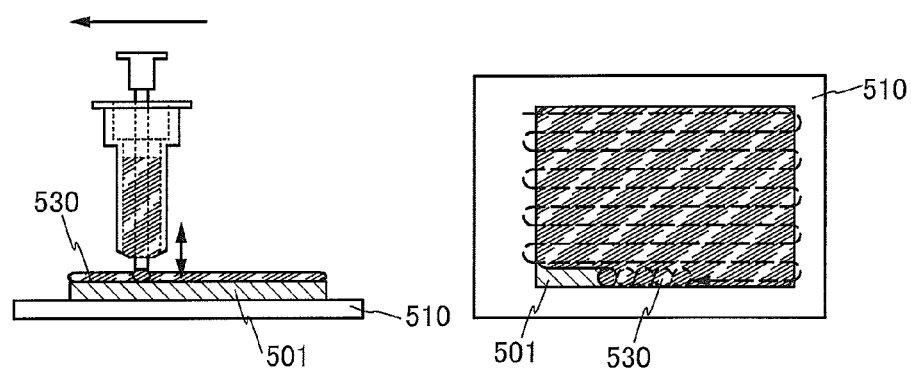

FIGS. 12A to 12C are schematic views describing an example of a method for forming the optical bonding layer 530 over the display portion 501.

An optical bonding layer can be formed directly on a light-transmitting layer by coating, printing, ink-jetting, or the like.

In particular, with the use of a needle with a fine tip, an optical bonding layer can be formed directly on a light-transmitting layer using a high viscosity material.

FIGS. 12A to 12C show an example of a method for forming the optical bonding layer 530 directly on the display portion 501 in which a light-transmitting layer is provided on the uppermost surface.

FIG. 12A shows formation of the optical bonding layer 530 while a syringe 1610 is scanned over the display portion 501 formed on the support substrate 510.

The syringe 1610 contains a material for forming the optical bonding layer 530 (also referred to as an optical bonding material). A needle 1615 is connected to a moving means such as an actuator and is capable of moving up and down in the syringe 1610 (see FIG. 12B).

The needle 1615 buried in the optical bonding material filled in the syringe (as shown on the left of FIG. 12B) projects (as shown the right of FIG. 12B), so that a fixed amount of an optical bonding material 530d is attached to the tip of the needle 1615. The tip is made close to the light-transmitting layer on the display portion 501, so that the optical bonding material 530d can be transferred to the light-transmitting layer.

FIG. 12C shows a state where the syringe 1610 is scanned over the display portion 501 formed over the support substrate 510 and the optical bonding layer 530 is formed over the entire surface of the display portion 501.

This embodiment can be combined with any of the other embodiments in this specification as appropriate.

Embodiment 5

In this embodiment, a structure of a light-emitting element which can be used for the light-emitting module according to one embodiment of the present invention will be described. Specifically, an example of a light-emitting element in which a layer containing a light-emitting organic compound is provided between a pair of electrodes is described with reference to FIGS. 6A to 6E.

The light-emitting element described in this embodiment as an example includes a lower electrode, an upper electrode, and a layer containing a light-emitting organic compound (hereinafter referred to as an EL layer) provided between the lower electrode and the upper electrode. One of the lower and upper electrodes functions as an anode, and the other functions as a cathode. The EL layer is provided between the lower electrode and the upper electrode, and a structure of the EL layer may be appropriately determined in accordance with materials of the lower electrode and the upper electrode. Examples of the structure of the light-emitting element will be described below; needless to say, the structure of the light-emitting element is not limited to the examples.

Structure Example 1 of Light-Emitting Element

Figure 6A:
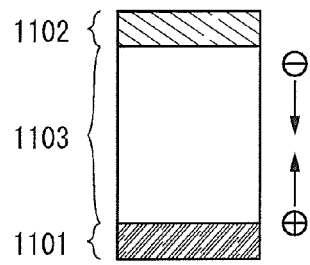
FIGS. 6A to 6E illustrate a light-emitting element according to an embodiment.

An example of a structure of a light-emitting element is illustrated in FIG. 6A. In the light-emitting element illustrated in FIG. 6A, an EL layer is provided between an anode 1101 and a cathode 1102.

When voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

In this specification, a layer or a stacked body which includes one region where electrons and holes injected from both ends are recombined is referred to as a light-emitting unit. Therefore, it can be said that Structure Example 1 of the light-emitting element includes one light-emitting unit.

A light-emitting unit 1103 includes at least a light-emitting layer containing a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (substance which blocks holes), a substance having a high electron-transport property, a substance having a high electron-injection property, and a substance having a bipolar property (substance having high electron- and hole-transport properties).

Figure 6B:
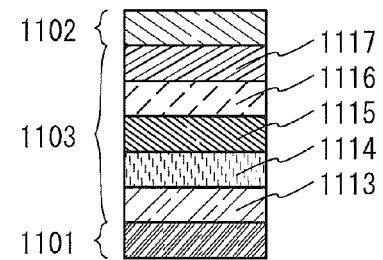

An example of a specific structure of the light-emitting unit 1103 is illustrated in FIG. 6B. In the light-emitting unit 1103 illustrated in FIG. 6B, a hole-injection layer 1113, a hole-transport layer 1114, a light-emitting layer 1115, an electron-transport layer 1116, and an electron-injection layer 1117 are stacked in this order from the anode 1101 side.

Structure Example 2 of Light-Emitting Element

Figure 6C:
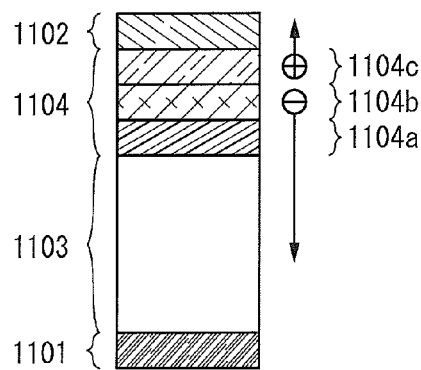

Another example of the structure of the light-emitting element is illustrated in FIG. 6C. In the light-emitting element illustrated in FIG. 6C, an EL layer including the light-emitting unit 1103 is provided between the anode 1101 and the cathode 1102. Further, an intermediate layer 1104 is provided between the cathode 1102 and the light-emitting unit 1103. Note that a structure similar to that of the light-emitting unit in Structure Example 1 of the light-emitting element, which is described above, can be applied to the light-emitting unit 1103 in Structure Example 2 of the light-emitting element and that the description of Structure Example 1 of the light-emitting element can be referred to for the details.

The intermediate layer 1104 is formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in this order from the cathode 1102 side.

The behavior of electrons and holes in the intermediate layer 1104 will be described. When voltage higher than the threshold voltage of the light-emitting element is applied between the anode 1101 and the cathode 1102, holes and electrons are generated in the first charge generation region 1104c, and the holes move into the cathode 1102 and the electrons move into the electron-relay layer 1104b. The electron-relay layer 1104b has a high electron-transport property and immediately transfers the electrons generated in the first charge generation region 1104c to the electron-injection buffer 1104a. The electron-injection buffer 1104a can reduce a barrier against electron injection into the light-emitting unit 1103, so that the efficiency of the electron injection into the light-emitting unit 1103 can be improved. Thus, the electrons generated in the first charge generation region 1104c are injected into the LUMO level of the light-emitting unit 1103 through the electron-relay layer 1104b and the electron-injection buffer 1104a.

In addition, the electron-relay layer 1104b can prevent interaction in which the substance contained in the first charge generation region 1104c and the substance included in the electron-injection buffer 1104a react with each other at the interface therebetween to impair the functions of the electron-injection buffer 1104a and the first charge generation region 1104c.

The range of choices of materials that can be used for the cathode in Structure Example 2 of the light-emitting element is wider than that of materials that can be used for the cathode in Structure Example 1 of the light-emitting element. This is because the cathode in Structure Example 2 can be formed using a material having a relatively high work function as long as the cathode receives holes generated in the intermediate layer.

Structure Example 3 of Light-Emitting Element

Figure 6D:
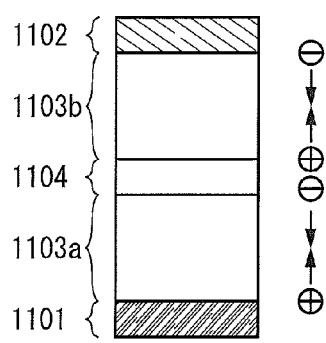
Figure 6E:
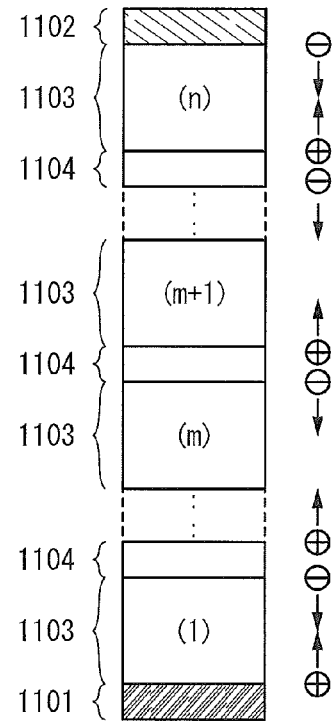

Another example of a structure of a light-emitting element is illustrated in FIG. 6D. In the light-emitting element illustrated in FIG. 6D, an EL layer including two light-emitting units is provided between the anode 1101 and the cathode 1102. Furthermore, the intermediate layer 1104 is provided between a first light-emitting unit 1103a and a second light-emitting unit 1103b.

Note that the number of the light-emitting units provided between the anode and the cathode is not limited to two. A light-emitting element illustrated in FIG. 6E has a structure in which a plurality of light-emitting units 1103 are stacked, that is, a so-called tandem structure. Note that in the case where n (n is a natural number greater than or equal to 2) light-emitting units 1103 are provided between the anode and the cathode, the intermediate layer 1104 is provided between an m-th (in is a natural number greater than or equal to 1 and less than or equal to n−1) light-emitting unit and an (m+1)-th light-emitting unit.

Note that a structure similar to that in Structure Example 1 of the light-emitting element can be applied to the light-emitting unit 1103 in Structure Example 3 of the light-emitting element; a structure similar to that in Structure Example 2 of the light-emitting element can be applied to the intermediate layer 1104 in Structure Example 3 of the light-emitting element. Therefore, the description of Structure Example 1 of the light-emitting element or the description of Structure Example 2 of the light-emitting element can be referred to for the details.

The behavior of electrons and holes in the intermediate layer 1104 provided between the light-emitting units will be described. When voltage higher than the threshold voltage of the light-emitting element is applied between the anode 1101 and the cathode 1102, holes and electrons are generated in the intermediate layer 1104, and the holes move into the light-emitting unit provided on the cathode 1102 side and the electrons move into the light-emitting unit provided on the anode side. The holes injected into the light-emitting unit provided on the cathode side are recombined with the electrons injected from the cathode side, so that a light-emitting substance contained in the light-emitting unit emits light. The electrons injected into the light-emitting unit provided on the anode side are recombined with the holes injected from the anode side, so that a light-emitting substance contained in the light-emitting unit emits light. Thus, the holes and electrons generated in the intermediate layer 1104 cause light emission in the respective light-emitting units.

Note that the light-emitting units can be provided in contact with each other when these light-emitting units allow the same structure as the intermediate layer to be formed therebetween. Specifically, when one surface of the light-emitting unit is provided with a charge generation region, the charge generation region functions as a first charge generation region of the intermediate layer; thus, the light-emitting units can be provided in contact with each other.

Structure Examples 1 to 3 of the light-emitting element can be implemented in combination. For example, an intermediate layer may be provided between the cathode and the light-emitting unit in Structure Example 3 of the light-emitting element.

<Structure Including Microresonator>

Note that a microresonator (microcavity) composed of a reflective film and a semi-transmissive and semi-reflective film overlapping the reflective film may be placed so as to sandwich a light-emitting element. By placing the light-emitting element in microresonator, interference of light emitted from the light-emitting element occurs, so that light of a specific color can be efficiently extracted.

Note that the semi-transmissive and semi-reflective film in this specification refers to a film transmitting and reflecting part of incident light. Further, the semi-transmissive and semi-reflective film used for the microresonator preferably absorbs less light.

The wavelength of extracted light depends on the distance between the reflective film and the semi-transmissive and semi-reflective film. An optical adjustment layer for adjusting the distance between the reflective film and the semi-transmissive and semi-reflective film may be provided in the light-emitting element in some cases.

A conductive film having light-transmitting property to visible light or an EL layer can be employed for a material that can be used for the optical adjustment layer.

For example, a stacked-layer film including a conductive film having light-transmitting property and a reflective film, or a stacked-layer film including a conductive film having light-transmitting property and a semi-transmissive and semi-reflective film can be used as a lower electrode or an upper electrode which also serves as the optical adjustment layer.

An interlayer whose thickness is adjusted may be used as the optical adjustment layer. Alternatively, a region whose thickness is adjusted and which contains a substance having a high hole-transport property and an acceptor substance with respect to the substance having a high hole-transport property can be used for the optical adjustment layer. The electric resistance of this component is lower than that of other components included in the EL layer. Thus, even if the thickness is increased for optical adjustment, this structure is preferable because an increase in driving voltage of a light-emitting element can be suppressed.

<Material for Light-Emitting Element>

Next, specific materials that can be used for the light-emitting elements having the above structures will be described; materials for the anode, the cathode, and the EL layer will be described in this order.

<<1. Material for Anode>>

The anode 1101 is formed with a single-layer structure or a stacked structure using any of a metal, an alloy, an electrically conductive compound, and a mixture thereof which have conductivity. In particular, a structure is preferred in which a material having a high work function (specifically, 4.0 eV or higher) is in contact with the EL layer.

Examples of the metal or the alloy material include gold (Au), platinum (Pt), nickel (Ni), tungsten (W), chromium (Cr), molybdenum (Mo), iron (Fe), cobalt (Co), copper (Cu), palladium (Pd), titanium (Ti), and the like, and an alloy thereof.

Examples of the electrically conductive compound include an oxide of a metal material, a nitride of a metal material, and a conductive high molecule.

Specific examples of the oxide of a metal material include indium tin oxide (ITO), indium tin oxide containing silicon or silicon oxide, indium tin oxide containing titanium, indium titanium oxide, indium tungsten oxide, indium zinc oxide, and indium zinc oxide containing tungsten. Specific examples of the oxide of a metal material further include molybdenum oxide, vanadium oxide, ruthenium oxide, tungsten oxide, manganese oxide, titanium oxide, and the like.

A film of the oxide of a metal material is usually formed by a sputtering method, but may be formed by application of a sol-gel method or the like.

Specific examples of the nitride of a metal material include titanium nitride, tantalum nitride, and the like.

Specific examples of the conductive high molecule include poly(3,4-ethylenedioxythiophene)/poly(styrenesulfonic acid) (PEDOT/PSS), polyaniline/poly(styrenesulfonic acid) (PAni/PSS), and the like.

Note that in the case where the second charge generation region is provided in contact with the anode 1101, a variety of electrically conductive materials can be used for the anode 1101 regardless of the size of their work functions. Specifically, besides a material which has a high work function, a material which has a low work function can also be used. A material that can be used for the second charge generation region and the first charge generation region will be described later.

<<2. Material for Cathode>>

In the case where the first charge generation region 1104c is provided between the cathode 1102 and the light-emitting unit 1103 to be in contact with the cathode 1102, a variety of conductive materials can be used for the cathode 1102 regardless of their work functions.

Note that at least one of the cathode 1102 and the anode 1101 is formed using a conductive film that transmits visible light. For example, when one of the cathode 1102 and the anode 1101 is formed using a conductive film which transmits visible light and the other is formed using a conductive film which reflects visible light, a light-emitting element which emits light from one side can be formed. Alternatively, when both the cathode 1102 and the anode 1101 are formed using conductive films which transmit visible light, a light-emitting element which emits light from both sides can be formed.

Examples of the electrically conductive film that transmits visible light are a film of indium tin oxide, a film of indium tin oxide containing silicon or silicon oxide, a film of indium tin oxide containing titanium, a film of indium titanium oxide, a film of indium tungsten oxide, a film of indium zinc oxide, and a film of indium zinc oxide containing tungsten. Further, a metal thin film whose thickness is set so that light is transmitted (preferably, thickness approximately greater than or equal to 5 nm and less than or equal to 30 nm) can also be used.

For the conductive film which reflects visible light, a metal is used, for example. Specific examples thereof include metal materials such as silver, aluminum, platinum, gold, and copper, and an alloy material containing any of these. Examples of the alloy containing silver include a silver-neodymium alloy and a magnesium-silver alloy. As examples of the alloy of aluminum, an aluminum-nickel-lanthanum alloy, an aluminum-titanium alloy, and an aluminum-neodymium alloy can be given.

<<3. Material for EL Layer>>

Specific examples of materials for the layers included in the light-emitting unit 1103 will be given below.

The hole-injection layer is a layer containing a substance having a high hole-injection property. As the substance having a high hole-injection property, for example, a molybdenum oxide, a vanadium oxide, a ruthenium oxide, a tungsten oxide, a manganese oxide, or the like can be used. Alternatively, the hole-injection layer 111 can be formed with a phthalocyanine compound such as phthalocyanine ($H_2Pc$) or copper phthalocyanine (CuPc), a high molecular compound such as poly(3,4-ethylenedioxythiophene)/poly(styrenesulfonic acid) (PEDOT/PSS), or the like.

Note that the hole-injection layer may be formed using the second charge generation region. When the second charge generation region is used for the hole-injection layer, a variety of conductive materials can be used for the anode 1101 regardless of their work functions as described above. Materials for forming the second charge generation region will be described later together with materials for forming the first charge generation region.

<<3.1. Hole-Transport Layer>>

The hole-transport layer is a layer containing a substance having a high hole-transport property. The hole-transport layer may have a stacked layer of two or more layers containing a substance having a high hole-transport property without limitation to a single layer. A substance having a hole-transport property higher than an electron-transport property is used. In particular, a substance having a hole mobility of $10^{-6}$ cm$^2$/Vs or higher is preferably used, in which case the driving voltage of the light-emitting element can be reduced.

As the substance having a high hole-transport property, an aromatic amine compound such as 4,4'-bis[N-(1-naphthyl)-N-phenylamino]biphenyl (abbreviation: NPB or a-NPD), or a carbazole derivative such as 9-[4-(10-phenyl-9-anthracenyl)phenyl]-9H-carbazole (abbreviation: CzPA) can be given. Further, a high molecular compound (e.g., poly(N-vinylcarbazole) (abbreviation: PVK)), or the like can be used.

<<3.2. Light-Emitting Layer>>

The light-emitting layer is a layer containing a light-emitting material. The light-emitting layer may have a stacked layer including two or more layers containing a light-emitting substance without limitation to a single layer. A fluorescent compound or a phosphorescent compound can be used as the light-emitting substance. A phosphorescent compound is preferably used as the light-emitting substance, in which case the emission efficiency of the light-emitting element can be increased.

As the light-emitting substance, a fluorescent compound (e.g., coumarin 545T) or a phosphorescent compound (e.g., tris(2-phenylpyridinato)iridium(III) (abbreviation: Ir(ppy)$_3$)) can be used.

Those light-emitting materials are preferably dispersed in a host material. A host material preferably has higher excitation energy than the light-emitting substance.

As the material which can be used as the host material, the above-described substance having a high hole-transport property (e.g., an aromatic amine compound, a carbazole derivative, and a high molecular compound), a substance having a high electron-transport property (e.g., a metal complex having a quinoline skeleton or a benzoquinoline skeleton and a metal complex having an oxazole-based ligand or a thiazole-based ligand), which will be described later, or the like can be used.

<<3.3. Electron-Transport Layer>>

The electron-transport layer is a layer containing a substance having a high electron-transport property. The electron-transport layer may have a stacked layer of two or more layers containing a substance having a high electron-transport property without limitation to a single layer. A substance having an electron-transport property higher than a hole-transport property is used. In particular, a substance having an electron mobility of $10^{-6}$ cm$^2$/Vs or higher is preferably used, in which case the driving voltage of the light-emitting element can be reduced.

As the substance having a high electron-transport property, a metal complex having a quinoline skeleton or a benzoquinoline skeleton (e.g., tris(8-quinolinolato)aluminum (abbreviation: Alq)), a metal complex having an oxazole-based or thiazole-based ligand (e.g., bis[2-(2-hydroxyphenyl)benzoxazolato]zinc (abbreviation: Zn(BOX)$_2$)), or another compound (e.g., bathophenanthroline (abbreviation: BPhen)) can be used. Further, a polymeric compound (e.g., poly[(9,9-dihexylfluorene-2,7-diyl)-co-(pyridine-3,5-diyl)] (abbreviation: PF-Py)) can be used.

<<3.4. Electron-Injection Layer>>

The electron-injection layer is a layer containing a substance having a high electron-injection property. The electron-injection layer may have a stacked layer including two or more layers containing a substance having a high electron-injection property without limitation to a single layer. The electron-injection layer is preferably provided, in which case the efficiency of electron injection from the cathode 1102 can be increased, so that the driving voltage of the light-emitting element can be reduced.

As the substance having a high electron-injection property, an alkali metal (e.g., lithium (Li), or cesium (Cs)), an alkaline earth metal (e.g., calcium (Ca)), a compound of such a metal (e.g., oxide (specifically, lithium oxide, or the like), a carbonate (specifically, lithium carbonate, cesium carbonate, or the like), a halide (specifically, lithium fluoride (LiF), cesium fluoride (CsF), or calcium fluoride (CaF$_2$)), or the like can be given.

Alternatively, the layer containing a high electron-injection property may be a layer containing a substance with a high electron-transport property and a donor substance (specifically, a layer made of Alq containing magnesium (Mg)). Note that the mass ratio of the added donor substance to the substance having an excellent electron-transport property is preferably 0.001:1 to 0.1:1.

As the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal.

<<3.5. Charge Generation Region>>

The first charge generation region 1104c and the second charge generation region are regions containing a substance having a high hole-transport property and an acceptor substance. The charge generation region is not limited to a structure in which a substance having a high hole-transport property and an acceptor substance are contained in the same film, and may have a structure in which a layer containing a substance having a high hole-transport property and a layer containing an acceptor substance are stacked. Note that in the case of a stacked-layer structure in which the first charge generation region is provided on the cathode side, the layer containing the substance having a high hole-transport property is in contact with the cathode 1102, and in the case of a stacked-layer structure in which the second charge generation region is provided on the anode side, the layer containing an acceptor substance is in contact with the anode 1101.

Note that the acceptor substance is preferably added to the charge generation region so that the mass ratio of the acceptor substance to the substance having a high hole-transport property is from 0.1:1 to 4.0:1.

As the acceptor substance that is used for the charge generation region, a transition metal oxide and an oxide of a metal belonging to any of Groups 4 to 8 of the periodic table can be given. Specifically, molybdenum oxide is particularly preferable. Note that molybdenum oxide has a low hygroscopic property.

As the substance having a high hole-transport property that is used for the charge generation region, any of a variety of organic compounds such as an aromatic amine compound, a carbazole derivative, an aromatic hydrocarbon, and a high molecular compound (such as an oligomer, a dendrimer, or a polymer) can be used. Specifically, use of a substance having a hole mobility of greater than or equal to $10^{-6}$ cm$^2$/(V·s) is preferable. However, besides the above materials, others may be used as long as the material has a higher hole transport property than an electron transport property.

<<Electron-Relay Layer>>

The electron-relay layer 1104b is a layer that can immediately receive electrons extracted by the acceptor substance in the first charge generation region 1104c. Therefore, the electron-relay layer 1104b is a layer containing a substance having a high electron-transport property, and the LUMO level of the electron-relay layer 1104b is positioned between the acceptor level of the acceptor substance in the first charge generation region 1104c and the LUMO level of the light-emitting unit 1103 with which the electron-relay layer is in contact. Specifically, the LUMO level of the electron-relay layer 14b is preferably approximately greater than or equal to −5.0 eV and less than or equal to −3.0 eV.

As the substance used for the electron-relay layer 1104b, a perylene derivative (e.g., 3,4,9,10-perylenetetracarboxylic dianhydride (abbreviation: PTCDA)), nitrogen-containing condensed aromatic compound (pyrazino[2,3-f][1,10] phenanthroline-2,3-dicarbonitrile (abbreviation: PPDN)), or the like can be given.

Note that a nitrogen-containing condensed aromatic compound is preferably used for the electron-relay layer 1104b because of its stability. Among nitrogen-containing condensed aromatic compounds, a compound having an electron-withdrawing group such as a cyano group or a fluoro group is preferably used, in which case electrons can be received more easily in the electron-relay layer 1104b.

<<Electron-Injection Buffer>>

An electron-injection buffer is a layer containing a substance having a high electron-injection property. The electron-injection buffer 1104a is a layer which facilitates electron injection from the first charge generation region 1104c into the light-emitting unit 1103. By providing the electron-injection buffer 1104a between the first charge generation region 1104c and the light-emitting unit 1103, the injection barrier therebetween can be reduced.

As the substance having a high electron-injection property, an alkali metal, an alkali earth metal, a rare earth metal, a compound of these metals, or the like can be given.

Further, the layer containing a substance having a high electron-injection property may be a layer containing a substance having a high electron-transport property and a donor substance.

<Method for Manufacturing Light-Emitting Element>

A method for manufacturing the light-emitting element will be described. Over the lower electrode, the layers described above are combined as appropriate to form the EL layer. Any of a variety of methods (e.g., a dry process or a wet process) can be used for the EL layer depending on the material for the EL layer. For example, a vacuum evaporation method, a transfer method, a printing method, an inkjet method, a spin coating method, or the like may be selected. Note that a different formation method may be employed for each layer. The upper electrode is formed over the EL layer. In this manner, the light-emitting element is manufactured.

The light-emitting element described in this embodiment can be manufactured by combining the above materials. Light emission from the above light-emitting material can be obtained with this light-emitting element, and the emission color can be selected by changing the type of the light-emitting material.

Further, when a plurality of light-emitting substances which emit light of different colors is used, the width of the emission spectrum can be expanded, whereby, for example, white light emission can be obtained. In order to obtain white light emission, for example, a structure may be employed in which at least two layers containing light-emitting substances are provided so that light of complementary colors is emitted. Specific examples of complementary colors are a combination of blue and yellow, a combination of blue-green and red, and the like.

Further, in order to obtain white light emission with an excellent color rendering property, an emission spectrum is preferred to spread through the entire visible light region. For example, a light-emitting element may include layers emitting light of blue, green, and red.

This embodiment can be combined with any of the other embodiments in this specification as appropriate.

Embodiment 6

In this embodiment, an electronic device of one embodiment of the present invention will be described with reference to FIGS. 7A to 7F.

The electronic devices of one embodiment of the present invention each include a display portion having a light-emitting module of one embodiment of the present invention and can display an image on the display portion. For example, video data broadcasted or distributed or video data stored in a data storage medium can be displayed. Further, data processed by a data processing device can be displayed. Furthermore, an image used for operation of a control panel or the like can be displayed.

Examples of an electronic device displaying video data include a television device and a digital photo frame.

Examples of the data processing device include a computer, a digital camera, a digital video camera, and a portable information terminal.

Examples of an electronic device including a control panel include a watch, a mobile phone, a portable game machine, a large-scale game machine (e.g., a pachinko machine), and an audio reproducing device.

<Television Device>

Figure 7A:
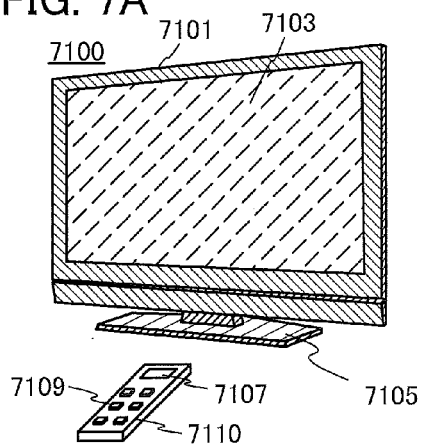
FIGS. 7A to 7F illustrate electronic devices according to an embodiment.

A television device 7100 includes a display portion 7103 incorporated in a housing 7101 supported by a stand 7105 (see FIG. 7A). The display portion 7103 including the light-emitting module of one embodiment of the present invention can display images.

A remote controller 7110 can control the television device 7100. For example, video displayed on the display portion 7103 can be switched, and volume can be adjusted.

The remote controller 7110 includes a data input and output panel 7107, an operation key 7109, and the like.

An image displayed on the display portion 7103 is supplied from a receiver or a modem for receiving data broadcasted or distributed.

The television device 7100 may be connected to Internet to perform two-way (e.g., between a sender and a receiver or between receivers) communication of data.

<Data Processing Device>

Figure 7B:
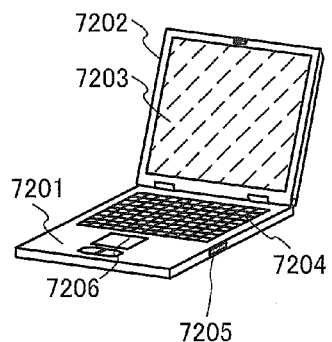

FIG. 7B illustrates a computer as an example of the data processing device. The computer includes a main body 7201, a housing 7202, a display portion 7203, a keyboard 7204, an external connection port 7205, a pointing device 7206, and the like. The display portion 7203 including the light-emitting module of one embodiment of the present invention can display images.

<Game Machine>

Figure 7C:
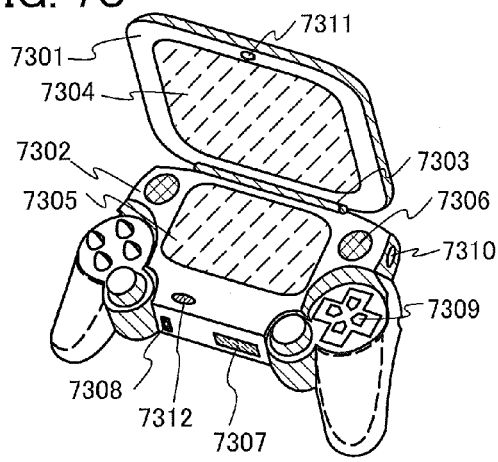

FIG. 7C illustrates an example of a portable game machine. A portable game machine illustrated as an example includes two housings, a housing 7301 and a housing 7302, which are jointed with a joint portion 7303 so that the portable game machine can be opened or folded. A first display portion 7304 is incorporated in the housing 7301 and a second display portion 7305 is incorporated in the housing 7302. The first display portion 7304 and the second display portion 7305 including the light-emitting module of one embodiment of the present invention can display images.

In addition, the portable game machine includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like.

The portable game machine has a function of reading a program or data stored in a recording medium to display it on the first display portion 7304 and the second display portion 7305, and a function of sharing information with another portable game machine by wireless communication.

<Mobile Phone>

Figure 7D:
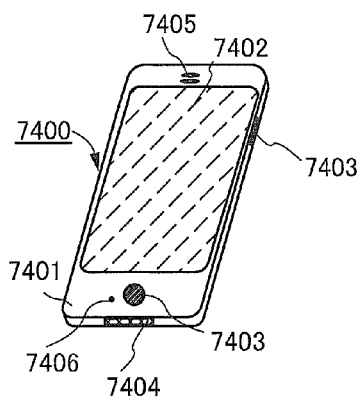

FIG. 7D illustrates an example of a mobile phone. A cellular phone 7400 is provided with a display portion 7402 incorporated in a housing 7401, an operation button 7403, an external connection port 7404, a speaker 7405, a microphone 7406, and the like. The display portion 7402 including the light-emitting module of one embodiment of the present invention can display images.

The display portion 7402 includes a proximity sensor; thus, data can be input when a finger or the like touches or approaches the data input and output panel 7107.

When a sensing device including a sensor such as a gyroscope or an acceleration sensor for detecting inclination is provided, display on the screen of the display portion 7402 can be automatically changed in direction by determining the orientation of the cellular phone 7400 (whether the cellular phone 7400 is placed horizontally or vertically for a landscape mode or a portrait mode).

The display portion 7402 can function as a two-dimensional image sensor. In that case, images of a palm print and a fingerprint of a hand which touches the display portion 7402, images of a palm vein and a finger vein which can be taken using a backlight or a sensing light source emitting near-infrared light, and the like can be used for personal authentication, for example.

<Portable Information Terminal>

Figure 7E:
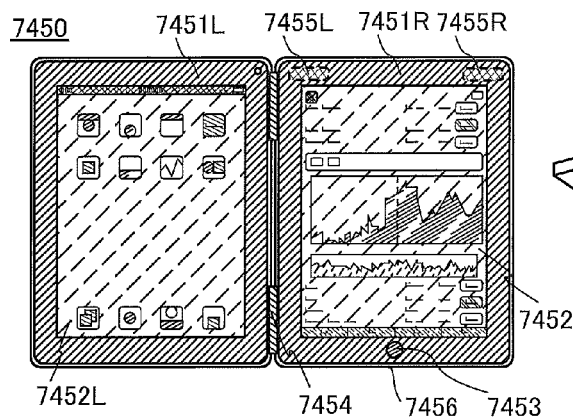

FIG. 7E illustrates an example of a foldable portable information terminal. A portable information terminal 7450 includes a housing 7451L and a housing 7451R connected by hinges 7454. The portable information terminal 7450 further includes an operation button 7453, a left speaker 7455L, and a right speaker 7455R. In addition, a side surface of the portable information terminal 7450 is provided with an external connection port 7456, which is not illustrated. Note that when the portable information terminal 7450 is folded on the hinges 7454 so that a display portion 7452L provided in the housing 7451L and a display portion 7452R provided in the housing 7451R can face each other, the display portion can be protected by the housings. The display portion 7452L and the display portion 7452R including the light-emitting module of one embodiment of the present invention can display images.

Further, the portable information terminal 7450 can also include a gyroscope, an acceleration sensor, a global positioning system (GPS) receiver, or a video camera. For example, when a detection device including a sensor for detecting inclination, such as a gyroscope or an acceleration sensor, is provided, the orientation of the display screen can be automatically changed by determining the orientation of the portable information terminal 7450 (whether the portable information terminal 7450 is placed horizontally or vertically).

Furthermore, the portable information terminal 7450 can be connected to a network. The portable information terminal 7450 not only can display data on the Internet but also can be used as a terminal which controls another electronic device connected to the network from a distant place.

<Lighting Device>

Figure 7F:
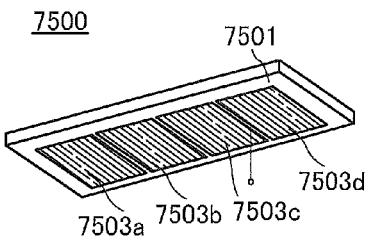

FIG. 7F is an example of a lighting device. A lighting device 7500 includes light-emitting devices 7503a, 7503b, 7503c, and 7503d incorporated in a housing 7501. The lighting device 7500 can be attached to a ceiling, a wall, or the like. Further, the lighting device 7500 includes a light-emitting module of one embodiment of the present invention.

Note that this embodiment can be combined with any of the other embodiments in this specification as appropriate.

Example

In this example, results of fabricating and driving a light-emitting device of one embodiment of the present invention will be described with reference to FIGS. 10A and 10B and FIG. 11.

Figure 10A:
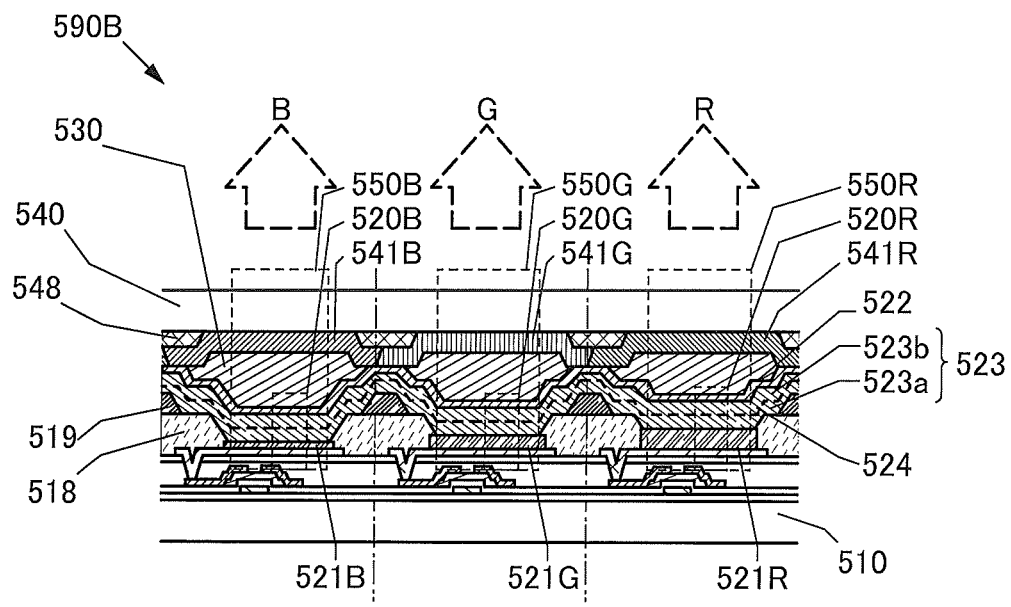
FIGS. 10A and 10B illustrate a structure of a light-emitting element included in a light-emitting panel according to one example.

FIG. 10A is a cross-sectional view of a light-emitting device including a light-emitting module of one embodiment of the present invention, which is described in this example. FIG. 10B is a schematic view of a structure of a light-emitting element included in the light-emitting module described in this example. FIG. 11 is a graph showing measurement results of current efficiency of light-emitting devices manufactured in this example, compared to that of a comparative example. Note that some of components are omitted in FIGS. 10A and 10B to avoid complexity for easy understanding.

Structure of Light-Emitting Panel in Example

A light-emitting panel 590B including light-emitting modules (e.g., light-emitting modules 550B, 550G, and 550R) arranged in matrix was fabricated. The light-emitting modules were placed at 26 μm apart in a horizontal direction (right and left direction on plane of paper in FIGS. 10A and 10B) and at 78 μm apart in a perpendicular direction (depth direction on plane of paper in FIGS. 10A and 10B). The aperture ratio of a display portion of the light-emitting panel 590B was 44.43%.

Structure of Light-Emitting Module in Example

The light-emitting modules (e.g., the light-emitting modules 550B, 550G, and 550R) each include the window material 540 having a light-transmitting property, the light-emitting element (e.g., the light-emitting element 520B, 520G, or 520R) that emits light transmitted from the light-transmitting layer 522 toward the window material 540, and the optical bonding layer 530 between the window material 540 and the light-transmitting layer 522. Note that the light-transmitting layer 522 also serves as an upper electrode of the light-emitting element. The light-emitting element includes a light-emitting region which is approximately a rectangle with side lengths of 13 μm and 68 μm.

The optical bonding layer 530 has a thick part with a thickness of 4 μm and a thin part which surrounds the thick part and is thinner than the thick part. Note that the smallest thickness of the thin part (between the window material and a spacer 519 maintaining the space between the partition walls 518 and 548) is approximately 0 μm, so that the optical bonding layer 530 is disconnected. The thick part overlaps the light-emitting element. The thin part surrounds the thick part.

For the optical bonding layer 530, a resin or a liquid crystal was used. Table 1 and 2 respectively show the refractive indexes of liquid crystals and those of resins, which were used for the optical bonding layer 530 in this example. Note that "ne" and "no" in Table denote the refractive index of an extraordinary ray and that of an ordinary ray, respectively. Liquid crystal 4 was made by adding a material for increasing refractive index to Liquid crystal 3.

Note that in a light-emitting module in which Liquid crystal 1 or 2 is used for the optical bonding layer, a reflective film had a structure in which an 8-nm-thick titanium film is stacked on a 200-nm-thick aluminum film. In a light-emitting module using a different optical bonding layer, a reflective film had a structure in which a 5-nm-thick titanium film is stacked on a 200-nm-thick aluminum film.

Further, a light-emitting module was fabricated using, as a light-transmitting layer, a conductive film in which a silicon nitride (abbreviation: SiN) film was stacked and using Liquid crystal 3 or 5 in contact with the silicon nitride film for an optical bonding layer. The silicon nitride film having polarity orients the liquid crystal.

Note that the light-emitting module including a color filter (e.g., a color filter 541B, 541G, or 541R) was used.

Structure of Light-Emitting Module Used as Comparative Example

A light-emitting panel including a light-emitting module in which a space between a window material and a light-transmitting layer was filled with dry nitrogen, instead of providing an optical bonding layer was fabricated and used as a comparative example.

TABLE 1

|  | Refractive index | |
| --- | --- | --- |
|  | ne | no |
| Liquid crystal 1 | 1.808 | 1.526 |
| Liquid crystal 2 | 1.808 | 1.526 |
| Liquid crystal 3 | 1.774 | 1.516 |
| Liquid crystal 5 | 1.766 | 1.527 |

TABLE 2

|  | Refractive index |
| --- | --- |
| Resin 1 | 1.52 |
| Resin 2 | 1.67 |

<Structure of Light-Emitting Element>

A light-emitting element (e.g., the light-emitting element 520B, 520G, or 520R) includes a lower electrode, an upper electrode, two light-emitting units (523a and 523b) between the lower electrode and the upper electrode, and an interlayer 524 between the light-emitting units.

Figure 10B:
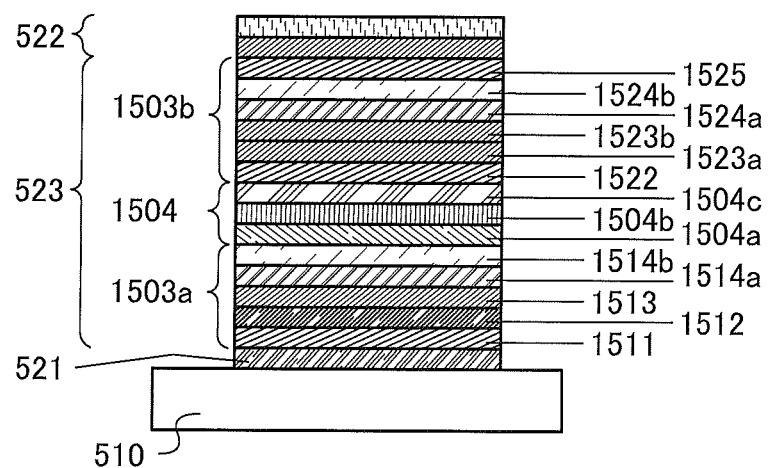

A structure of the light-emitting element is illustrated in FIGS. 10A and 10B. The light-emitting element includes the light-transmitting layer 522 also serving as an upper electrode, a lower electrode 521 overlapping the light-transmitting layer 522, and the layer 523 containing a light-emitting organic compound between the light-transmitting layer 522 and the lower electrode 521. Note that the lower electrode 521 is provided over the support substrate 510.

Note that a semi-transmissive and semi-reflective film was used as the light-transmitting layer 522 and the lower electrode 521 stacked on a reflective film was used to form a microresonator.

<<Structure of Lower Electrode>>

A reflective film had a structure in which a 5-nm-thick or an 8-nm-thick titanium film is stacked on a 200-nm-thick aluminum film Note that the reflective film also serves as a wiring for supplying power to the lower electrode 521. As the lower electrode 521, an indium-tin oxide film containing silicon oxide ("an ITSO film") was used.

Note that the ITSO film also serves as an optical adjustment layer. The thickness of the optical adjustment layer was optimized for each light emission color. Specifically, a light-emitting module for emitting red light was provided with an 85-nm-thick ITSO film, a light-emitting module for emitting green light was provided with a 45-nm-thick ITSO film, and a light-emitting module for emitting blue light was provided with a 5-nm-thick ITSO film.

<<Structure of Upper Electrode>>

As the light-transmitting layer 522 serving as the upper electrode, a film in which 70-nm-thick indium tin oxide (abbreviation: ITO) was stacked on a 15-nm-thick silver-magnesium alloy film was used. The silver-magnesium alloy film was formed by co-evaporation with a weight ratio of 10:1 (=Ag:Mg).

<<Structure of Layer Containing Light-Emitting Organic Compound>>

The layer 523 containing a light-emitting organic compound had a structure in which two EL layers (a first EL layer 1503a and a second EL layer 1503b) were provided with an intermediate layer 1504 interposed therebetween. This structure is referred to as a tandem structure.

The first EL layer 1503a was formed by depositing a hole-injection layer 1511, a first hole-transport layer 1512, a first light-emitting layer 1513, a first electron-transport layer 1514a, and a second electron-transport layer 1514b in this order over the lower electrode 521.

The intermediate layer 1504 was formed by depositing an electron-injection buffer layer 1504a, an electron-relay layer 1504b, and a charge generation region 1504c in this order over the electron-transport layer 1514b.

The second EL layer 1503b was formed by depositing a second hole-transport layer 1522, a second light-emitting layer 1523a, a third light-emitting layer 1523b, a third electron-transport layer 1524a, a fourth electron-transport layer 1524b, and an electron-injection layer 1525 in this order over the intermediate layer 1504.

Table 3 shows details of materials used for the layer containing a light-emitting organic compound. Note that the thickness of the hole-transport layer 1512 varied depending on the structure of the lower electrode. Specifically, when a 200-nm-thick aluminum film on which a 5-nm-thick titanium film was stacked was used as the lower electrode, the thickness of the hole-transport layer 1512 was 13 nm; when the lower electrode had a structure in which an 8-nm-thick titanium film was stacked on a 200-nm-thick aluminum film, the thickness of the hole-transport layer 1512 was 10 nm.

TABLE 3

| | First EL layer 1503a | | | | | Intermediate layer 1504 | | |
|---|---|---|---|---|---|---|---|---|
| | Hole-injection layer | Hole-transport layer | Light-emitting layer | Electron-transport layer | | Electron-injection buffer layer | Electron-relay layer | Charge generation region |
| | 1511 | 1512 | 1513 | 1514a | 1514b | 1504a | 1504b | 1504c |
| EL layer | PCzPA:MoOx (=2:1) 13 nm | PCzPA Ti(8): 10 nm Ti(5): 13 nm | CzPA:1,6-mMemFLPAPrn (=1:0.05) 30 nm | CzPA 5 nm | BPhen 15 nm | Li 0.1 nm | CuPc 2 nm | BPAFLP:MoOx (=2:1) 13 nm |

| | Second EL layer 1503b | | | | | |
|---|---|---|---|---|---|---|
| | Hole-transport layer | Light-emitting layer | | Electron-transport layer | | Electron-injection layer |
| | 1522 | 1523a | 1523b | 1524a | 1524b | 1525 |
| EL layer | BPAFLP 20 nm | 2mDBTPDBqII:PCBA1BP:Ir(tBppm)₂acac (=0.8:0.2:0.06) 20 nm | 2mDBTPDBqII:Ir(tppr)₂dpm (=1:0.02) 20 nm | 2mDBTPDBqII 15 nm | BPhen 15 nm | LiF 1 nm |

✕:MoOx is molybdenum oxide

Structural formulas of part of the organic compounds used in this example are shown below.

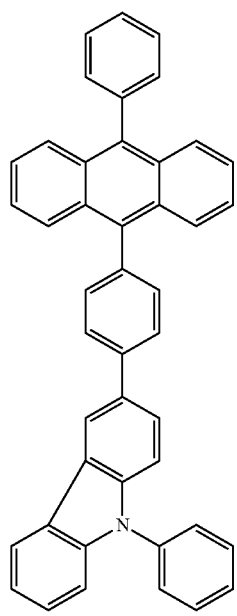

PCzPA

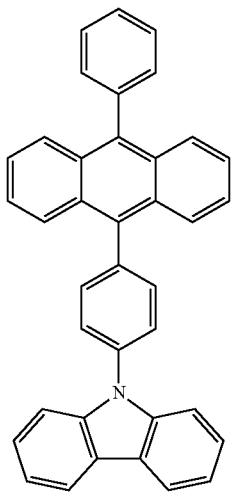

CzPA

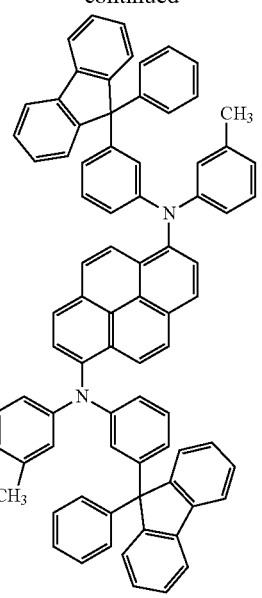

1,6mMemFLPAPrn

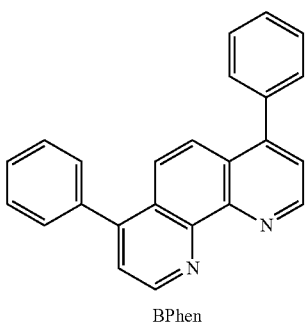

BPhen

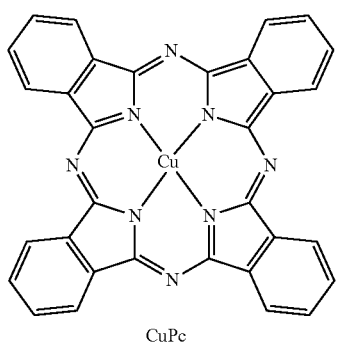

CuPc

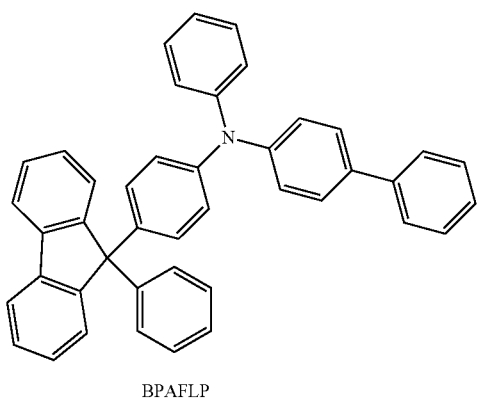

BPAFLP

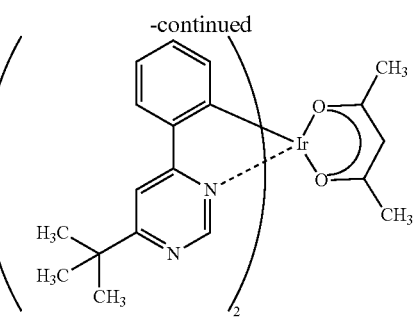

[Ir(tBuppm)₂(acac)]

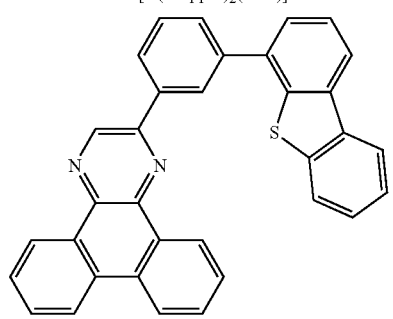

2mDBTPDBq-II

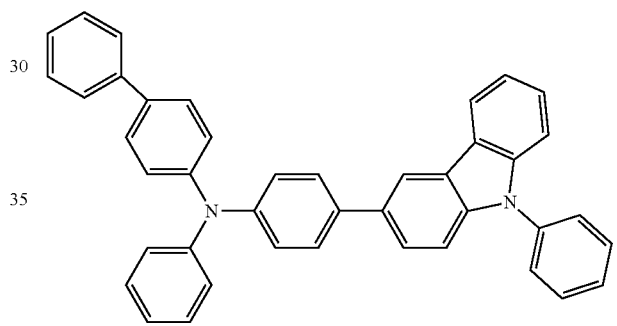

PCBA1BP

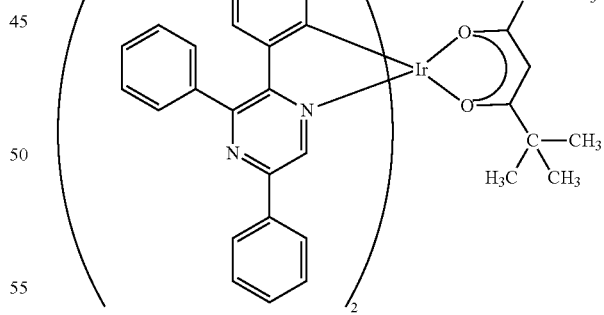

[Ir(tppr)₂(dpm)]

<Evaluation Method>

The light-emitting panel (comparative example) including the light-emitting module in which a space between the window material 540 and the light-transmitting layer 522 was filled with dry nitrogen, and the light-emitting panel of one embodiment of the present invention (example) were driven under the same conditions. The ratio of the current efficiency of the light-emitting panel of Example to the current efficiency of the light-emitting panel of the comparative example was calculated.

<Evaluation Results>

Figure 11:
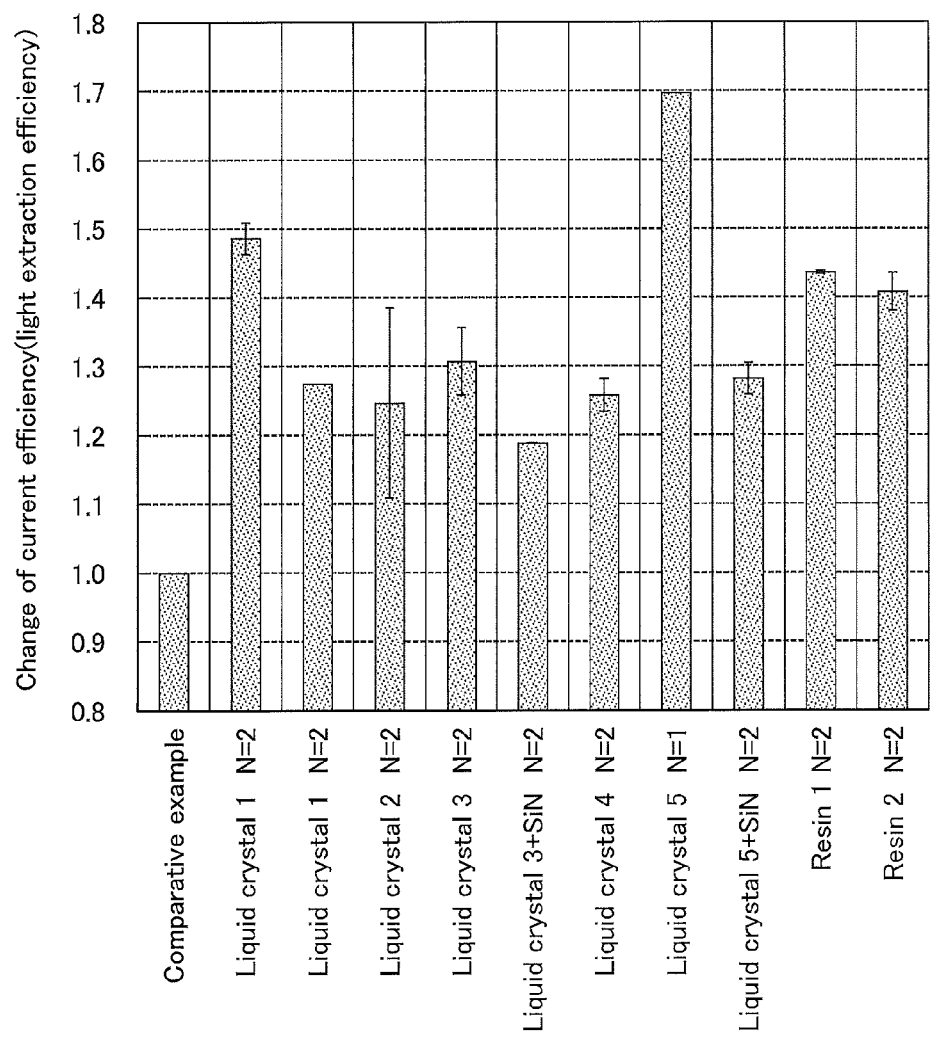
FIG. 11 is a graph showing results of the current efficiency of a light-emitting panel of Example, compared to the current efficiency of a comparative example.

FIG. 11 shows the ratio of the current efficiency of the light-emitting panel of Example to the current efficiency of the light-emitting panel of the comparative example. Note that the number of experiments performed under the same conditions was denoted by N in the graph. The bar on the extreme left shows the current efficiency of the light-emitting panel of the comparative example, which is regarded as 1. Each bar, in order from left to right, shows the ratio of the current efficiency of the light-emitting panel using Liquid crystal 1, 2, or 3 for the optical bonding layer to the current efficiency of the light-emitting panel of the comparative example was shown.

In FIG. 11, a bar denoted by Liquid crystal 3+SiN shows the ratio of the current efficiency of the light-emitting panel in which a conductive film on which a silicon nitride (abbreviation: SiN) film was stacked was used as a light-transmitting layer and Liquid crystal 3 in contact with the silicon nitride film was used as an optical bonding layer.

The ratio of the current efficiency of the light-emitting panel using Liquid crystal 4 or 5 to the current efficiency of the light-emitting panel of the comparative example was shown.

A bar denoted by Liquid crystal 5+SiN shows the ratio of the current efficiency of the light-emitting panel in which a conductive film on which a silicon nitride (abbreviation: SiN) film was stacked was used as a light-transmitting layer and Liquid crystal 5 in contact with the silicon nitride film was used as an optical bonding layer.

The ratio of the current efficiency of the light-emitting panel using Resin 1 or 2 to the current efficiency of the light-emitting panel of the comparative example was shown.

All of the light-emitting panels of this example emitted light at a current efficiency approximately 1.2 or more times higher than the current efficiency of the light-emitting panel of the comparative example. This example shows that, with the use of a light-emitting module of one embodiment of the present invention, a light-emitting module in which light emitted from a light-emitting element can be efficiently extracted can be provided.

This application is based on Japanese Patent Application serial no. 2013-057440 filed with Japan Patent Office on Mar. 20, 2013, the entire contents of which are hereby incorporated by reference.

What is claimed is:

1. A light-emitting module comprising:
a window material having a light-transmitting property;
an organic electroluminescent element over a substrate;
a first layer between the window material and the organic electroluminescent element, the first layer including a first part overlapping with the organic electroluminescent element, a second part around the first part, and a third part between the first part and the second part; and
a sealing material provided between the window material and the substrate,
wherein the window material and the substrate are bonded to each other by the sealing material,
wherein the sealing material is in contact with the first layer and the window material,
wherein the sealing material is arranged at a periphery portion of the substrate,
wherein the first part is thicker than the second part,
wherein the organic electroluminescent element includes a first electrode, a second electrode overlapping with the first electrode, and a second layer containing a light-emitting organic compound between the first electrode and the second electrode,
wherein a refractive index of the first layer is higher than or equal to a refractive index of the second layer and higher than a refractive index of the window material, and
wherein a refractive index of the third part changes continuously.

2. The light-emitting module according to claim 1, wherein the organic electroluminescent element includes a light-emitting region of larger than or equal to 800 $\mu m^2$ and smaller than 1500 $\mu m^2$, and
wherein the second part is provided along an end portion of the light-emitting region.

3. The light-emitting module according to claim 1, wherein the window material includes a structure for diffusing light or a moth-eye structure.

4. A light-emitting device comprising the light-emitting module according to claim 1.

5. A light-emitting module comprising:
a window material having a light-transmitting property;
an organic electroluminescent element over a substrate;
a first layer between the window material and the organic electroluminescent element, the first layer including a first part overlapping with the organic electroluminescent element, a second part around the first part, and a third part between the first part and the second part;
a partition wall surrounding the organic electroluminescent element; and
a sealing material provided between the window material and the substrate,
wherein the window material and the substrate are bonded to each other by the sealing material,
wherein the sealing material is in contact with the first layer and the window material,
wherein the sealing material is arranged at a periphery portion of the substrate,
wherein the first part is thicker than the second part,
wherein the organic electroluminescent element includes a first electrode, a second electrode overlapping with the first electrode, and a second layer containing a light-emitting organic compound between the first electrode and the second electrode,
wherein the partition wall has an opening which is widened in a direction in which the organic electroluminescent element emits light,
wherein a bottom end portion of the opening is in contact with the second electrode and a side surface of the opening is in contact with the second layer,
wherein a refractive index of the partition wall is lower than a refractive index of the second layer, and
wherein a refractive index of the third part changes continuously.

6. The light-emitting module according to claim 5, wherein the organic electroluminescent element includes a light-emitting region of larger than or equal to 800 $\mu m^2$ and smaller than 1500 $\mu m^2$, and
wherein the second part is provided along an end portion of the light-emitting region.

7. The light-emitting module according to claim 5, wherein the window material includes a structure for diffusing light or a moth-eye structure.

8. A light-emitting device comprising the light-emitting module according to claim 5.

9. A light-emitting module comprising:
a window material having a light-transmitting property;
an organic electroluminescent element over a substrate;

a first layer between the window material and the organic electroluminescent element, the first layer including a first part overlapping with the organic electroluminescent element, a second part around the first part, and a third part between the first part and the second part; and a sealing material provided between the window material and the substrate, wherein the window material and the substrate are bonded to each other by the sealing material, wherein the sealing material is in contact with the first layer and the window material, wherein the sealing material is arranged at a periphery portion of the substrate, wherein the organic electroluminescent element includes a first electrode, a second electrode overlapping with the first electrode, and a layer containing a light-emitting organic compound between the first electrode and the second electrode, wherein the window material has a refractive index of higher than or equal to 1.5 and lower than or equal to 1.65, wherein a light-transmitting layer comprising the first electrode has a refractive index of higher than or equal to 1.7 and lower than or equal to 2.1, wherein the first layer has a refractive index of higher than 1.5 and lower than or equal to 3.0, and wherein a refractive index of the third part changes continuously.

10. The light-emitting module according to claim 9, wherein the organic electroluminescent element includes a light-emitting region of larger than or equal to 800 μm$^2$ and smaller than 1500 μm$^2$, and wherein the second part is provided along an end portion of the light-emitting region.

11. The light-emitting module according to claim 9, wherein the window material includes a structure for diffusing light or a moth-eye structure.

12. A light-emitting device comprising the light-emitting module according to claim 9.

13. A light-emitting module comprising:
a window material having a light-transmitting property;
an organic electroluminescent element over a substrate;
a first layer between the window material and the organic electroluminescent element, the first layer including a birefringence material whose refractive index is reduced toward a window material side; and
a sealing material provided between the window material and the substrate,
wherein the window material and the substrate are bonded to each other by the sealing material,
wherein the sealing material is in contact with the first layer and the window material,
wherein the sealing material is arranged at a periphery portion of the substrate,
wherein the first layer includes a first part overlapping with the organic electroluminescent element, a second part around the first part, and a third part between the first part and the second part,
wherein the first part is thicker than the second part,
wherein the organic electroluminescent element includes a first electrode, a second electrode overlapping with the first electrode, and a second layer containing a light-emitting organic compound between the first electrode and the second electrode, and
wherein a refractive index of the third part changes continuously.

14. The light-emitting module according to claim 13, wherein a refractive index of the first layer is lower than a refractive index of the second layer and higher than a refractive index of the window material.

15. The light-emitting module according to claim 13, wherein the birefringence material has a refractive index of 1.65 or lower and a refractive index of 1.75 or higher.

16. The light-emitting module according to claim 13,
wherein the organic electroluminescent element includes a light-emitting region of larger than or equal to 800 μm$^2$ and smaller than 1500 μm$^2$, and
wherein the second part is provided along an end portion of the light-emitting region.

17. The light-emitting module according to claim 13, further comprising a first alignment film in contact with the first layer,
wherein the first layer contains a liquid crystal, and
wherein the first alignment film is provided between the organic electroluminescent element and the first layer.

18. The light-emitting module according to claim 13, further comprising a first alignment film in contact with the first layer,
wherein the first layer contains a liquid crystal, and
wherein the first alignment film is provided between the first layer and the window material.

19. The light-emitting module according to claim 13, further comprising:
a first alignment film between the organic electroluminescent element and the first layer; and
a second alignment film between the first layer and the window material,
wherein the first layer contains a liquid crystal, and
wherein each of the first alignment film and the second alignment film is in contact with the first layer.

20. A light-emitting device comprising the light-emitting module according to claim 13.

* * * * *